(12) United States Patent
Ikeda

(10) Patent No.: US 6,215,695 B1
(45) Date of Patent: Apr. 10, 2001

(54) MAGNETORESISTANCE ELEMENT AND MAGNETIC MEMORY DEVICE EMPLOYING THE SAME

(75) Inventor: Takashi Ikeda, Nagoya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/457,084

(22) Filed: Dec. 7, 1999

(30) Foreign Application Priority Data

| Dec. 8, 1998 | (JP) | 10-349020 |
| Apr. 16, 1999 | (JP) | 11-109572 |
| Apr. 16, 1999 | (JP) | 11-109574 |

(51) Int. Cl.[7] .................................................. G11C 11/00
(52) U.S. Cl. ........................................................ 365/158
(58) Field of Search ................................. 365/158, 171, 365/173; 360/113

(56) References Cited

U.S. PATENT DOCUMENTS

| 5,287,238 | * | 2/1994 | Baumgart et al. | 360/113 |
| 5,432,734 | * | 7/1995 | Kawano et al. | 365/158 |
| 5,448,515 | * | 9/1995 | Fukami et al. | 365/171 |
| 5,691,936 | * | 11/1997 | Sakakima et al. | 365/158 |
| 5,825,685 | * | 10/1998 | Yamane et al. | 365/158 |
| 5,856,897 | * | 1/1999 | Mauri | 360/113 |
| 5,953,248 | * | 9/1999 | Chen et al. | 365/158 |
| 6,069,820 | * | 5/2000 | Inomata et al. | 365/171 |

* cited by examiner

*Primary Examiner*—Trong Phan
(74) *Attorney, Agent, or Firm*—Fitzpatrick, Cella, Harper & Scinto

(57) ABSTRACT

A magnetoresistance element comprises a substrate, a first ferromagnetic layer formed on the substrate, a second ferromagnetic layer formed in lamination on the first ferromagnetic layer and having lower coercivity than the first ferromagnetic layer, a nonmagnetic layer formed between the first and second ferromagnetic layers, a first antiferromagnetic layer exchange-coupled to the first ferromagnetic layer, and a second antiferromagnetic layer exchange-coupled to the second ferromagnetic layer, wherein the direction of unidirectional anisotropy of the first antiferromagnetic layer is parallel to the magnetization direction of unidirectional anisotropy of the second antiferromagnetic layer is parallel to the magnetization direction of the second ferromagnetic layer. Utilizing this magnetoresistance element is a magnetic memory device, which stores information by changing the magnetizing direction of the first ferromagnetic layer in accordance with such information, and employs the second ferromagnetic layer as a detection layer for detecting the information so stored.

8 Claims, 16 Drawing Sheets

MAGNETORESISTANCE ELEMENT AND MAGNETIC MEMORY DEVICE EMPLOYING THE SAME

BACKGROUND OF THE INVENTION

1. Field of the Invention

The present invention relates to a magnetoresistance element having magnetization stability and showing high magnetoresistance ratio. The present invention relates also to a magnetic memory device (nonvolatile memory device) employing the magnetoresistance element.

2. Related Background Art

The magnetoresistance effect type memory device conducts recording by magnetization direction of a magnetic layer corresponding to digital information. This type of memory device does not require energy supply from the outside for memory retention, and can be produced by a simple process in comparison with a semiconductor memory device without limitation of the substrate material. Therefore, this type of memory device is promising as an inexpensive nonvolatile memory device having a large capacity.

FIG. 1 is a schematic sectional view of an example of constitution of a conventional magnetoresistance effect type memory device. This magnetoresistance effect type memory device as shown in FIG. 1 has basically a sandwich structure having nonmagnetic layer 52 between two ferromagnetic layers 51, 53. The process for detecting the recorded information is classified roughly into two types. The function of the ferromagnetic layers 51, 53 differs depending on the type of the detection process.

A first type of the process is described below.

In the first type of process, two ferromagnetic layers 51, 53 are constituted to be different in the coercivity: the layer of lower coercivity serving as a detection layer, and the other layer of higher coercivity serving as a memory layer. The coercivity of ferromagnetic layers 51, 53 is differentiated usually by changing the constituting chemical elements or composition of the layers or by changing the layer thickness.

The recording is conducted by application of a recording magnetic field (Hw) greater than the coercivity of the memory layer to parallelize the magnetization direction of the memory layer to the recording magnetic field (Hw). This process is explained by reference to FIGS. 2A and 2B. FIGS. 2A and 2B are schematic drawings illustrating the states of the recorded information in a conventional magnetoresistance effect type memory device. In FIGS. 2A and 2B, the device comprises memory layer 61 having higher coercivity, nonmagnetic layer 62, and detection layer 63 having ferromagnetism of lower coercivity than memory layer 61.

In FIG. 2A, for example, the symbol "0" denotes the state that memory layer 61 under nonmagnetic layer 62 is magnetized in a − direction (leftward direction), and as shown in FIG. 2B, the symbol "1" denotes the state that memory layer 61 is magnetized in a + direction (rightward direction). Immediately after the recording, the magnetization directions of the both layers are parallel, since the coercivity of detection layer 63 is less than that of memory layer 61.

The detection is conducted by applying direct electric current at a prescribed intensity to the memory device, applying simultaneously thereto a magnetic field (Ha) less intense than the coercivity of memory layer 61, and measuring the potential change caused by reversal of magnetization in detection layer 63. In the state of the parallel magnetization of both magnetic layers, the resistivity of the element is lower than that in the state of the antiparallel magnetization.

The states are shown in FIGS. 3A to 3C through FIG. 6. FIGS. 3A to 3C and FIGS. 5A to 5C are schematic drawings for explaining the change of magnetization of the respective layers by application of a magnetic field. In these drawings, the same symbols as in FIGS. 2A and 2B are used for the corresponding members without special explanation. FIGS. 4 and 6 are respectively a timing chart showing the potential change by application of a magnetic field: the abscissa showing the time t, and the ordinate showing the electric potential V.

As shown in FIGS. 3A to 3C, on application of a detecting magnetic field of +Ha to a memory device having a record of the state "0", for example, as shown in FIG. 3A, the magnetization directions of the both magnetic layers (memory layer 61, and detection layer 63) become antiparallel as shown in FIG. 3B to raise the electric potential, and on subsequent application of the magnetic field of −Ha, the magnetization directions become parallel to lower the potential. FIG. 4 shows the change of the electric potential.

Similarly, as shown in FIGS. 5A to 5C, on application of detecting magnetic field of +Ha to a memory device having a record of state "1", as shown in FIG. 5A, the magnetization directions of the both magnetic layers become parallel as shown in FIG. 5B to lower the electric potential, and on subsequent application of the magnetic field of −Ha, the magnetization directions become antiparallel to raise the electric potential. FIG. 6 shows the change of the electric potential. In this type of the detection, detected signal depends only on the magnetization direction of the memory layer independently of the magnetization direction of the detection layer before the detection, which enables precise detection of the information recorded in the memory layer.

Another type of process is described by reference to FIGS. 7A and 7B. FIGS. 7A and 7B show schematically magnetization directions of magnetoresistance effect type memory device. In this process, as shown in FIGS. 7A and 7B, two ferromagnetic layers holds a nonmagnetic layer 72. One of the two ferromagnetic layers is employed as fixed-magnetization layer 71 which is magnetized in a fixed direction, and the other one is employed as memory layer 73. The magnetization of memory layer 73 is forced to be parallel to the direction of the applied magnetic field. The fixed-magnetization layer 71 can be formed by giving coercivity greater than the recording magnetic field to the ferromagnetic layer. The magnetization-reversing field in the fixed magnetization direction can be intensified by formation of exchange-coupling with an antiferromagnetic layer.

FIG. 8 shows shift of the magnetization loop of a film of "ferromagnetic layer/antiferromagnetic layer" formed by exchange-coupling of a ferromagnetic layer and an antiferromagnetic layer. FIG. 8 shows the rightward shift corresponding to Hex (exchange-coupling magnetic field). As shown in FIG. 8, the magnetization-reversing field is Hex±Hc (where Hc is the coercivity of the ferromagnetic layer). Therefore, the stronger magnetic field is required for reversing the magnetization by application of a magnetic field in a direction of the shift of the magnetization loop than that for a ferromagnetic single layer.

In the case where the shift of the magnetization loop is greater than the coercivity, namely Hex>Hc, the magnetization is directed, under zero magnetic field, invariably to a fixed direction. In such a case, even if the magnetization is reversed by some cause, the magnetization returns to the original state, requiring no initialization.

With such a magnetoresistance effect type memory device, information is detected by applying a magnetic field, to the memory device in a state of absence of application of a magnetic field, at a magnetic field intensity for reversing the magnetization of memory layer 73 in a prescribed direction, and measuring the change of the output voltage. This process is shown in FIGS. 10A and 10B through FIG. 13. FIGS. 10A and 10B and FIGS. 12A and 12B illustrate schematically the change of magnetization of the respective layers on application of a magnetic field. In these drawings, the same symbols as in FIGS. 7A and 7B are used for denoting the corresponding members without explanation. FIGS. 11, 12A, 12B and 13 are respectively a timing chart for illustrating the change of the electric potential on application of a magnetic field with the abscissa representing time t, and the ordinate representing an electric potential V.

In FIGS. 10A and 10B and FIGS. 12A and 12B, the fixed magnetization is directed rightward, and the magnetization of memory layer 73 is directed rightward in state "0" and directed leftward in state "1". In FIGS. 10A and 10B, application of a detecting magnetic field does not change the magnetization direction of memory layer 73 having the record "0", causing no change in the output voltage as shown in FIG. 11. On the other hand in memory layer 73 having the record "1", as shown in FIGS. 12A and 12B, the magnetization of the two ferromagnetic layers changes from an antiparallel state to a parallel state as shown in FIGS. 13 to decrease the magnetoresistance to lower the detected voltage.

Such a detection method, however, will erase the recorded information, and will require rewriting for retaining the information. For avoiding the erasure and rewriting of the information, the information should be detected without application of a magnetic field. Therefore, the values of the output voltage of the state "0" and of the state "1" should be known preliminarily.

For obtaining a high S/N ratio, the magnetoresistance ratio is preferably higher. The magnetoresistance ratio depends on the material of the magnetic layer, the state of the interface between the layers, and other factors. In a spin-scatter type film constitution, it depends also on the thickness of the nonmagnetic layer between the magnetic layers. This phenomenon is called a shunt effect, by which an increase of thickness of the nonmagnetic layer lowers the magnetoresistance ratio owing to the increase of electrons flowing through the nonmagnetic layer without participating in the change in magnetoresistance. In view of the shunt effect, the nonmagnetic layer is preferably thinner.

The memory device utilizing the magnetoresistance change, when employed for mobile information instrument, should be capable of memorizing in high density. In such a memory device, the cell area should be made smaller. For the fine working, useful are photolithography and FIB (focused ion beam etching) employed in a semiconductor process.

As described above, in the spin-scatter type magnetoresistance effect type memory device, the nonmagnetic layer held between the ferromagnetic layers is preferably thinner in view of the shunt effect. However, the thinner nonmagnetic layer causes increase of a magnetostatic coupling field between the ferromagnetic layers. This magnetostatic coupling field serves to parallelize the magnetization direction in the two ferromagnetic layers. Accordingly, this greater magnetostatic coupling field retards the change of the magnetization into the antiparallel state, preventing the change in magnetoresistance.

The intensity of diamagnetizing field of the ferromagnetic body depends on its shape: the smaller ratio of the length in easy magnetization direction to the layer thickness increases the intensity of the diamagnetizing field. In other words, if the area of the memory cell is decreased without changing the layer thickness of the magnetic layer of a magnetoresistance effect type memory device, the diamagnetizing field is intensified to render the magnetization unstable, which makes impossible the retention and detection of information. On the other hand, the decrease of the thickness of the magnetic layer is limited in view of formation of uniform thickness of a magnetic thin film for high-density memory. The same problem arises in a spin-tunnel type memory device having a nonmagnetic layer constituted of the insulation film.

Thus, the material for the ferromagnetic layer of a high-density memory device has preferably uniaxial magnetic anisotropy and sufficiently high coercivity. However, such a material has not been found yet.

SUMMARY OF THE INVENTION

An object of the present invention is to provide a magnetic memory device which solves the above problems of the prior art, enabling easy control of the coercivity and stable retention of the magnetization direction with a small size with high recording density, and to provide a magnetoresistance element useful for the magnetic memory device.

Another object of the present invention is to provide a magnetic memory device which has the nonmagnetic layer made thinner between the ferromagnetic layers and exhibits high magnetoresistance ratio, and to provide a magnetoresistance element useful for the magnetic memory device.

The magnetoresistance element of an embodiment of the present invention comprises a substrate, a first ferromagnetic layer formed on the substrate, a second ferromagnetic layer formed in lamination on the first ferromagnetic layer, a nonmagnetic layer formed between the first and second ferromagnetic layers, and an antiferromagnetic layer exchange-coupled to the first ferromagnetic layer, wherein the direction of unidirectional anisotropy of the antiferromagnetic layer is parallel to the magnetization direction of the first ferromagnetic layer.

The magnetoresistance element of another embodiment of the present invention comprises a substrate, a first ferromagnetic layer formed on the substrate, a second ferromagnetic layer formed in lamination on the first ferromagnetic layer and having lower coercivity than the first ferromagnetic layer, a nonmagnetic layer formed between the first and second ferromagnetic layers, a first antiferromagnetic layer exchange-coupled to the first ferromagnetic layer, and a second antiferromagnetic layer exchange-coupled to the second ferromagnetic layer, wherein the direction of unidirectional anisotropy of the first antiferromagnetic layer is parallel to the magnetization direction of the first ferromagnetic layer, and the direction of unidirectional anisotropy of the second antiferromagnetic layer is parallel to the magnetization direction of the second ferromagnetic layer.

The magnetic memory device of the present invention employs any of the aforementioned magnetic resistance element to memorize information by change of the magnetization direction of the first ferromagnetic layer in accordance with the information.

DESCRIPTION OF THE PREFERRED EMBODIMENTS

The present invention is described in detail by reference to drawings.

Firstly, a first embodiment of the present invention is explained.

Figure 1:
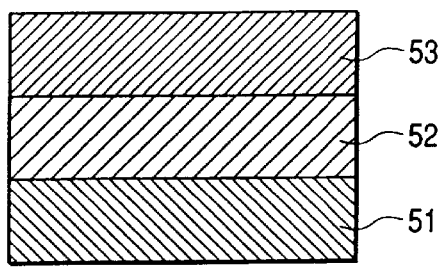
FIG. 1 is a schematic sectional view illustrating an example of constitution of a conventional magnetoresistance effect type memory device.
Figure 2A:
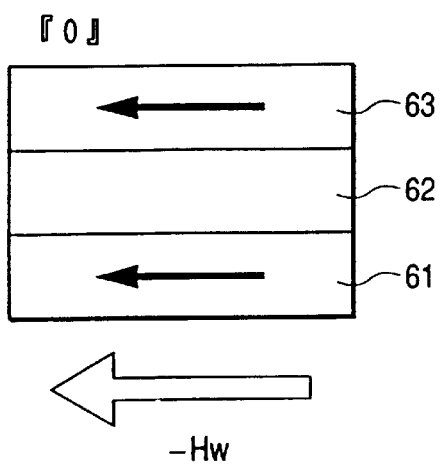
FIG. 2A and FIG. 2B illustrate states of information recorded in a conventional magnetoresistance effect type memory device.
Figure 2B:
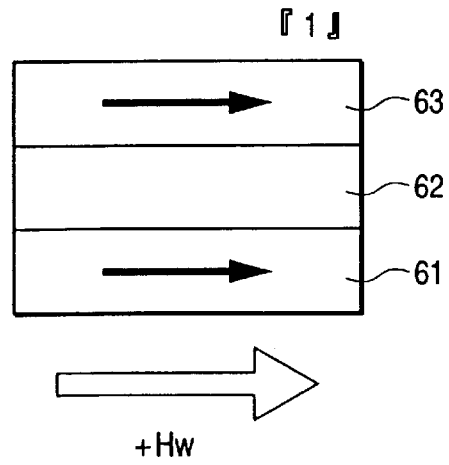
Figure 3A:
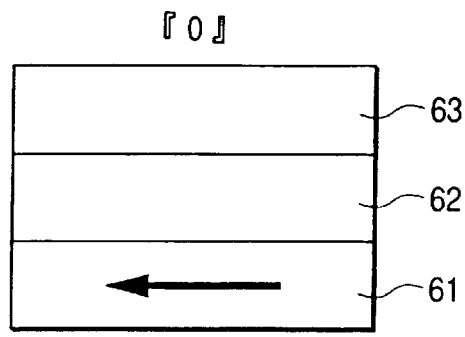
FIG. 3A, FIG. 3B, and FIG. 3C illustrate schematically the changes of magnetization in the respective layers in the memory device shown in FIG. 2A on application of a magnetic field.
Figure 3B:
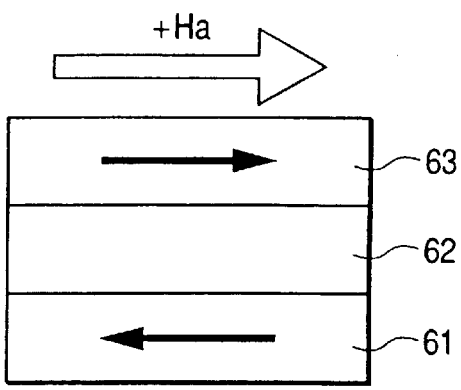
Figure 3C:
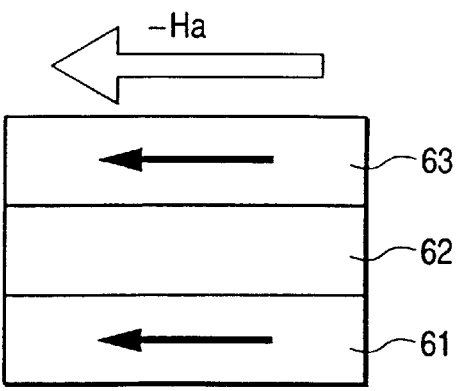
Figure 4:
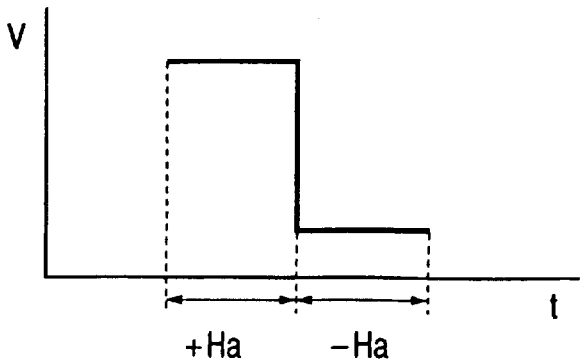
FIG. 4 is a timing chart showing the change of the potential in the memory device shown in FIG. 2A on application of a magnetic field.
Figure 5A:
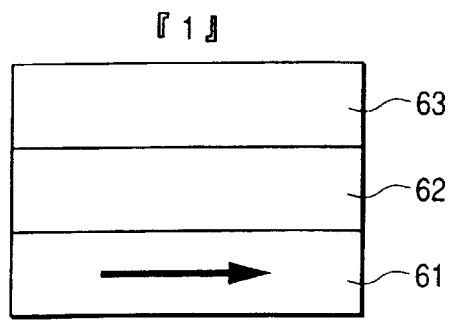
FIG. 5A, FIG. 5B, and FIG. 5C illustrate schematically the changes of magnetization in the respective layers in the memory device shown in FIG. 2B on application of a magnetic field.
Figure 5B:
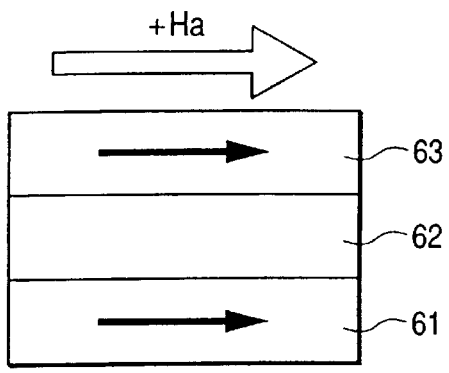
Figure 5C:
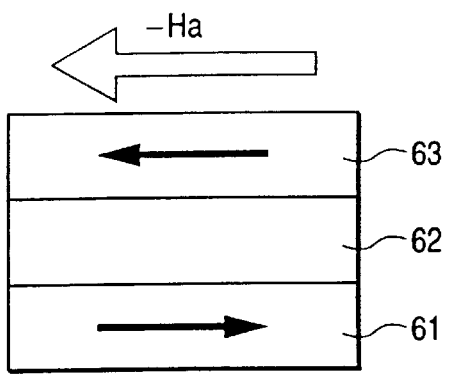
Figure 6:
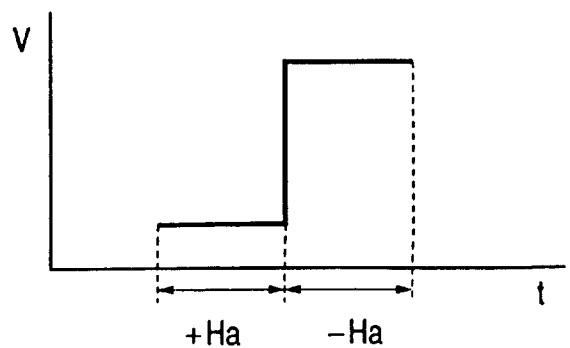
FIG. 6 is a timing chart showing the change of the potential in the memory device shown in FIG. 2B on application of a magnetic field.
Figure 7A:
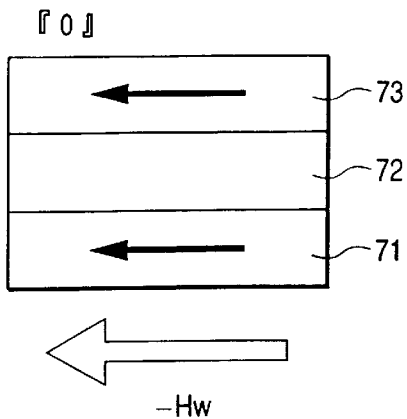
FIG. 7A and FIG. 7B illustrate schematically another method for detecting information from a conventional magnetoresistance effect type memory device.
Figure 7B:
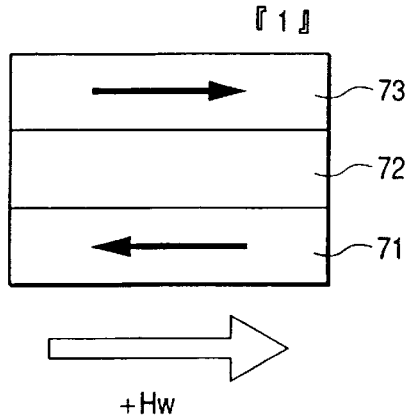
Figure 8:
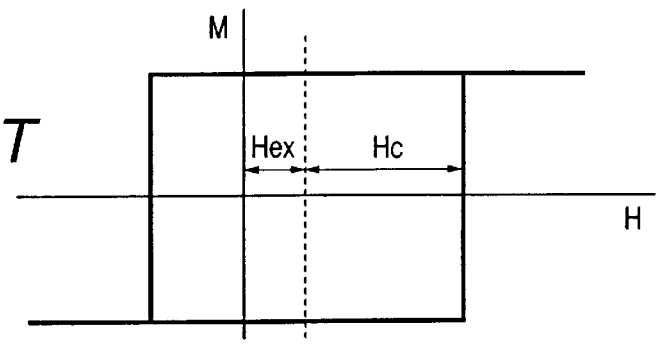
FIG. 8 illustrates the state of a shift of a magnetization loop of a film formed by exchange-coupling of a ferromagnetic layer and an antiferromagnetic layer.
Figure 9:
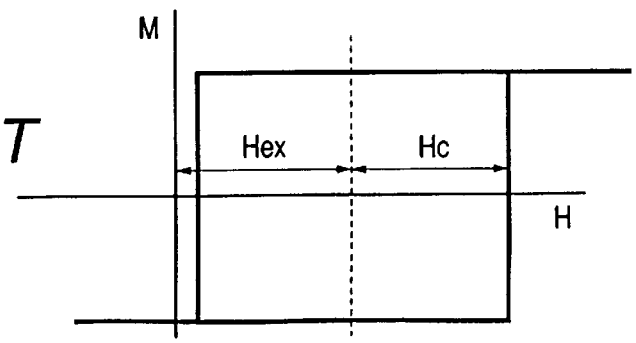
FIG. 9 illustrates a magnetic loop shifted more in comparison with that shown in FIG. 8.
Figure 10A:
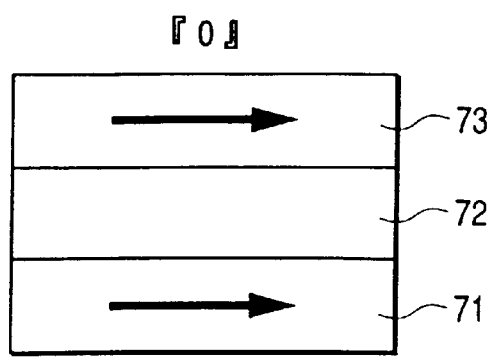
FIG. 10A and FIG. 10B are schematic drawings for explaining the change of magnetization of the layers on application of a magnetic field to a memory device having two ferromagnetic layers magnetized in a parallel direction.
Figure 10B:
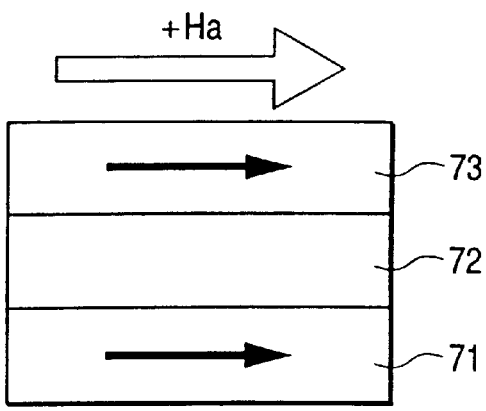
Figure 11:
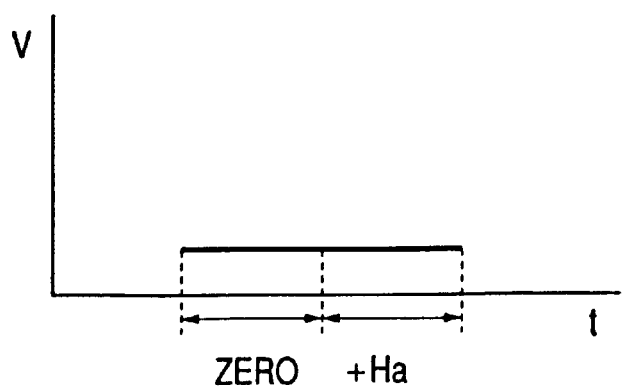
FIG. 11 is a timing chart showing the change of the electric potential in the memory device having two ferromagnetic layers magnetized in a parallel direction on application of a magnetic field.
Figure 12A:
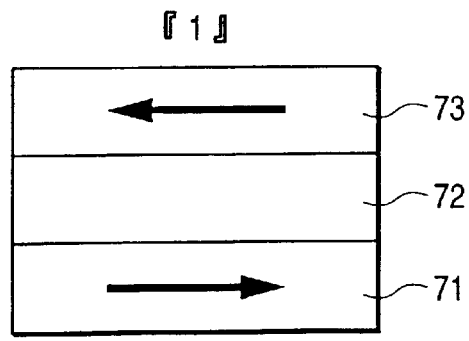
FIG. 12A and FIG. 12B are schematic drawings for explaining the change of magnetization of the layers on application of a magnetic field to a memory device having two ferromagnetic layers magnetized in antiparallel directions.
Figure 12B:
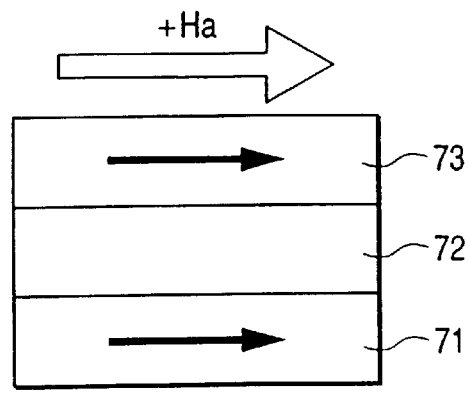
Figure 13:
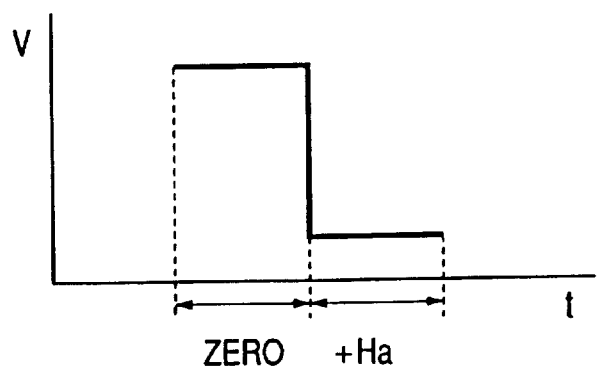
FIG. 13 is a timing chart showing the change of the potential in the memory device having two ferromagnetic layers magnetized in antiparallel directions on application of a magnetic field.
Figure 14:
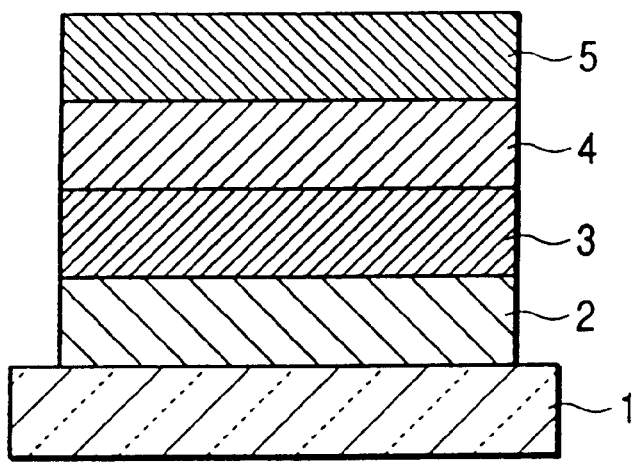
FIG. 14 is a schematic sectional view showing a layer constitution of a magnetic memory device of a first embodiment of the present invention.

FIG. 14 is a schematic sectional view showing a layer constitution of a magnetic memory device of the first embodiment of the present invention. In FIG. 14, the memory device is constituted of substrate 1, antiferromagnetic layer 2, first ferromagnetic layer 3, nonmagnetic layer 4, and second ferromagnetic layer 5.

Figure 15:
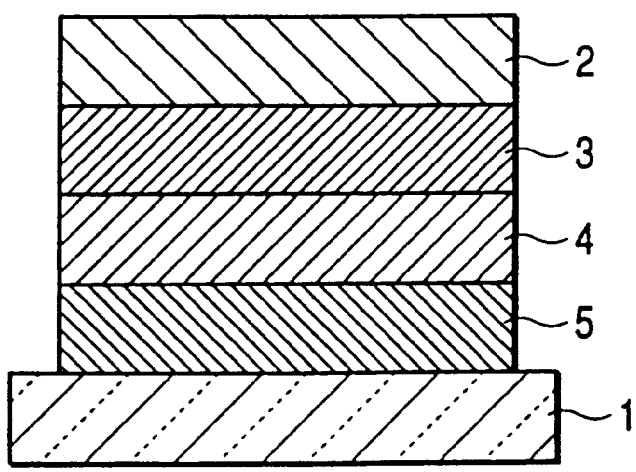
FIG. 15 is a schematic sectional view showing a modification of the memory device of the first embodiment of the present invention.

FIG. 15 is a schematic sectional view showing a modification of the memory device of the first embodiment of the present invention. In FIG. 15, the same symbols as in FIG. 14 are used for denoting the corresponding members. As shown in FIG. 15, the layers may be formed in lamination on substrate 1 in the order reverse to the layer lamination order in FIG. 14: namely, in the order of second ferromagnetic layer 5, nonmagnetic layer 4, first ferromagnetic layer 3, and antiferromagnetic layer 2.

Antiferromagnetic layer 2 may be formed from a Mn type or Cr type antiferromagnetic material such as MnFe, MnIr, MnPt, MnPtCr, and AlCr; or an oxide antiferromagnetic material such as NiO, and α-$Fe_2O_3$, the material preferably having a Néel temperature higher than the operation temperature. In particular, magnetic memory devices employing an oxide antiferromagnetic material are expected to give high magnetoresistance ratio because of no occurrence of electron shunting in the antiferromagnetic material. First and second ferromagnetic layers 3, 5 may be formed from Co, CoFe, Fe, NiFe, or the like. Nonmagnetic layer 4 may be formed from Cu, $Al_2O_3$, or the like.

The reversal of the unidirectional anisotropy of antiferromagnetic layer 2 is conducted through magnetization of first ferromagnetic layer 3 exchange-coupling thereto. Specifically, in a state that the direction of unidirectional anisotropy of antiferromagnetic layer 2 and the direction of magnetization of first ferromagnetic layer 3 are parallel to each other, the magnetization of first ferromagnetic layer 3 is reversed by applying an external magnetic field in an antiparallel direction from the outside to the layers, and then the magnetic moment of atoms of antiferromagnetic layer 2 exchange-coupled thereto which atoms exist in an interface between the ferromagnetic layer and the antiferromagnetic layer is reversed, and then the magnetic moment of atoms in antiferromagnetic layer 2 which atoms are distant from the interface is reversed by the interaction, successively. Thus the unidirectional anisotropy of antiferromagnetic layer 2 is reversed.

Figure 16:
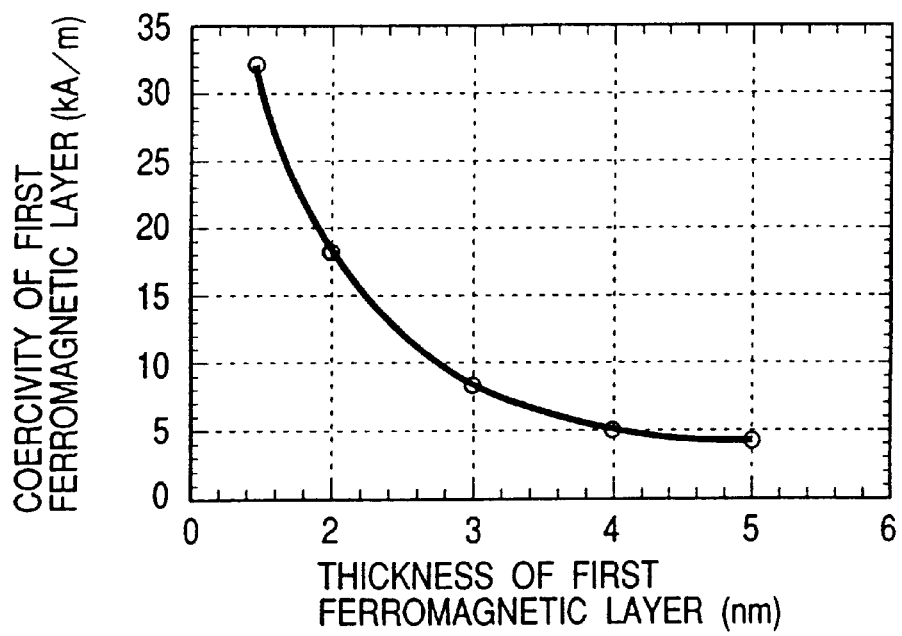
FIG. 16 is a graph showing dependence of the coercivity on the thickness of the first ferromagnetic layer.
Figure 17:
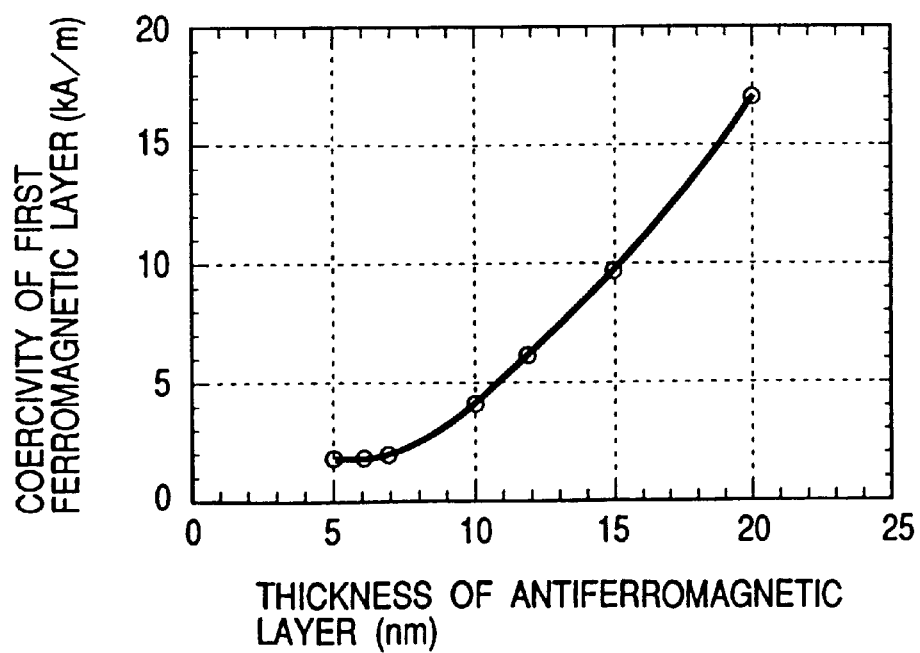
FIG. 17 is a graph showing dependence of the coercivity of the first magnetic layer on the thickness of the antiferromagnetic layer.

The coercivity of first ferromagnetic layer 3 in this embodiment varies depending on the thickness of first ferromagnetic layer 3, the exchange-coupling field between first ferromagnetic layer 3 and antiferromagnetic layer 2, and the thickness of antiferromagnetic layer 2. In particular, the coercivity can readily be adjusted by selecting properly the thickness of first ferromagnetic layer 3 or of antiferromagnetic layer 2. FIG. 16 shows the dependence of the coercivity on the thickness of first ferromagnetic layer 3. In the measurement, the sample employed was a magnetoresistance effect film formed by successive lamination of an NiO layer of 10 nm thick as antiferromagnetic layer 2, a CoFe layer as first ferromagnetic layer 3, a Cu layer of 5 nm thick as nonmagnetic layer 4, and an NiFe layer of 5 nm thick as second ferromagnetic layer 5 on a glass substrate. As shown by FIG. 16, the coercivity of first ferromagnetic layer 3 is inversely proportional approximately to the layer thickness. FIG. 17 shows dependence of the coercivity of first ferromagnetic layer 3 on the thickness of the NiO layer with the thickness of the FeCo layer kept unchanged at 5 nm in the above-mentioned magnetoresistance effect film. The increase of the NiO layer thickness increases the coercivity of first ferromagnetic layer 3. Therefore, the coercivity of first ferromagnetic layer 3 can be adjusted by varying the thickness of the NiO layer. However, in this magnetic memory device, increase of the NiO layer thickness to 20 nm or more causes shifting of the magnetization curve and the magnetoresistance curve in the magnetic field direction, which makes insufficient the reversal of unidirectional anisotropy of the NiO layer.

Japanese Patent Application Laid-Open No. 6-295419, for example, discloses another magnetic memory device formed successive lamination of a first ferromagnetic layer, a nonmagnetic layer, a second ferromagnetic layer, and an antiferromagnetic layer. In the magnetic memory device disclosed in this Laid-Open Publication, the second ferromagnetic layer which is exchange-coupled to the antiferromagnetic layer is magnetized in a fixed direction, and the unidirectional anisotropy will not reversed. Japanese Patent Application Laid-Open No. 9-139068 discloses a magnetic memory device having a ferromagnetic layer which is exchange-coupled to an antiferromagnetic layer and is magnetized reversibly in the magnetization direction. However, the antiferromagnetic layer thereof has unidirectional anisotropy which is not reversible. Therefore, the intensity of the magnetic field for making antiparallel the magnetization differs depending on the direction of magnetic field application. With such a magnetic memory device, the intensity of the recording magnetic field or detecting magnetic field varies depending on the direction of the magnetic field application, which complicates the magnetic field application circuit, undesirably. For reversing the unidirectional anisotropy of the antiferromagnetic layer, the thickness of the antiferromagnetic layer is selected so as not to accumulate the exchange energy in the antiferromagnetic layer. The layer thickness therefor depends on the material and construction of the antiferromagnetic layer.

Figure 18:
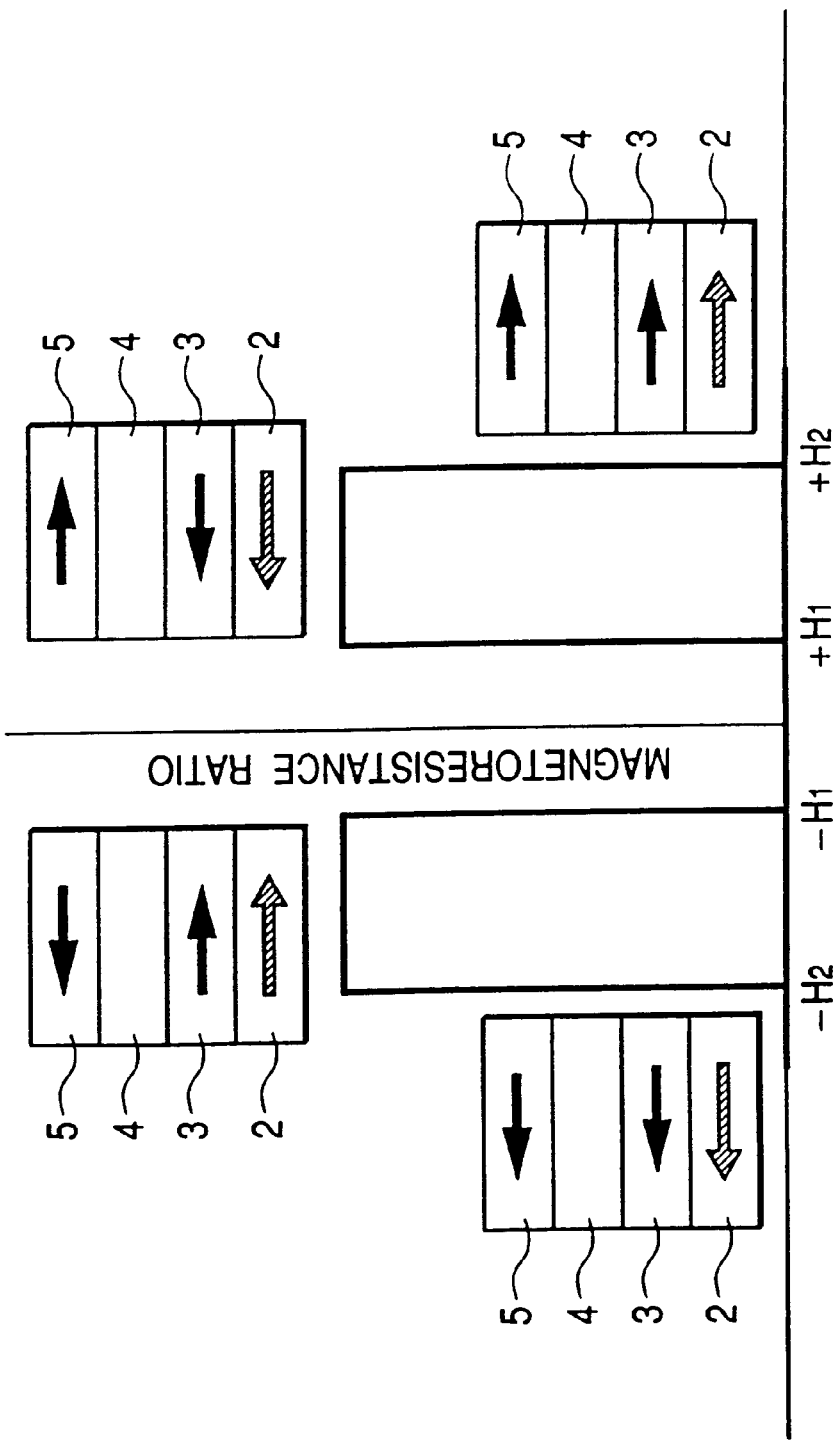
FIG. 18 is a schematic diagram showing the magnetoresistance curve of the magnetic memory device of FIG. 14, and the changes of the direction of magnetization of the ferromagnetic layer and of the direction of the unidirectional anisotropy of the corresponding antiferromagnetic layer.

FIG. 18 shows the magnetoresistance curve of the magnetic memory device of FIG. 14 together with the changes of directions of magnetization of the ferromagnetic layers and the unidirectional anisotropy of the corresponding antiferromagnetic layer of the device. In FIG. 18, the same symbols as in FIG. 14 are used for denoting the corresponding members without explanation.

In FIG. 18, in the initial state, the applied magnetic field H is in the range of $H<-H_1$. In this initial state, the magnetization direction and the unidirectional anisotropy direction of the layers are entirely parallel to the applied magnetic field as shown at the left end of FIG. 18. When the applied magnetic field is changed to be in the range of $H_2<H<H_1$, the magnetization of second ferromagnetic layer 5 having relatively weak coercivity is reversed to be antiparallel to that of the first ferromagnetic layer 3. As a result, the resistivity of the element changes to high. $H_2$ is the sum of the inherent coercivity $H_{c2}$ of second ferromagnetic layer 5 and the magnetostatic coupling field $H_s$ between the two ferromagnetic layers.

When the applied magnetic field is further intensified to be $H_1<H$, the magnetization of first magnetic layer 3 and the unidirectional anisotropy of antiferromagnetic layer 2 are reversed simultaneously to lower the resistivity again. $H_2$ is represented by the value obtained by adding the inherent coercivity $H_{c1}$ of first ferromagnetic layer 3 and the exchange-coupling field $H_{ex}$ exerting to antiferromagnetic layer 2 and subtracting from the sum the magnetostatic coupling field $H_s$ exerting to second ferromagnetic layer 5.

Further, by changing the applied magnetic field to be in the range of $-H_1<H<-H_2$, the magnetization of the second ferromagnetic layer is reversed. By changing the applied magnetic field to be in the range of $H<-H_1$, the initial state is attained.

The first embodiment of the present invention is described more specifically by reference to examples.

[EXAMPLE 1]

The layers were formed in lamination successively on glass substrate 1, as shown in FIG. 15, in the order of an $Ni_{80}Fe_{20}$ layer of 5 nm thick as second ferromagnetic layer 5, a Cu layer of 2.2 nm thick as nonmagnetic layer 4, a $Co_{90}Fe_{10}$ layer of 5 nm thick as first ferromagnetic layer 3, and an $Ir_{50}Mn_{50}$ layer of 3 nm thick as antiferromagnetic layer 2, by sputtering continuously (without breaking the vacuum). For sharp reversal of magnetization of the ferromagnetic layers, a DC magnetic field of about 6 kA/m was applied during formation of the layers in the direction parallel to the direction of detecting and recording magnetic field application to induce in-plane uniaxial magnetic anisotropy.

Figure 19:
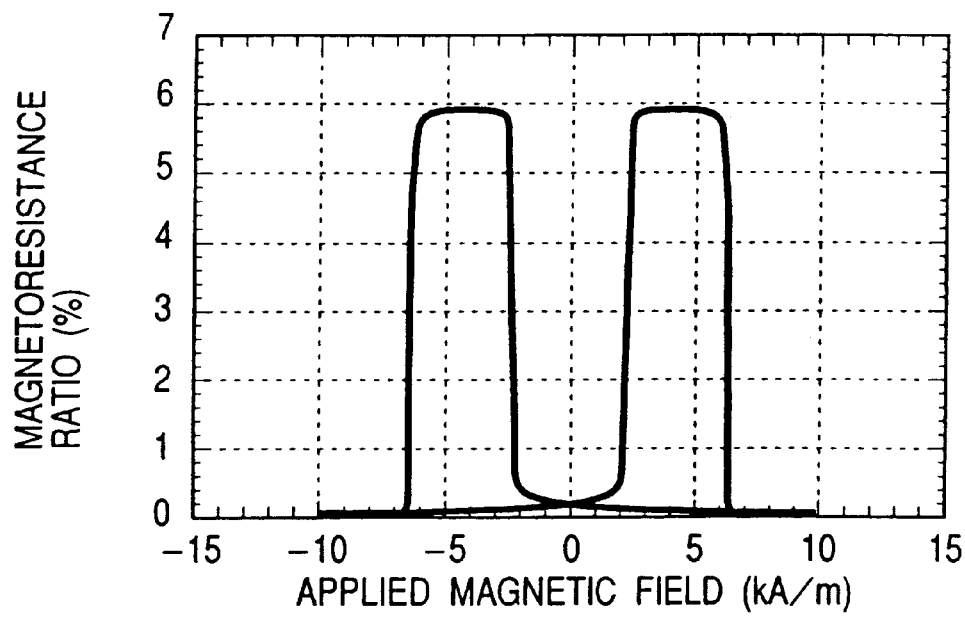
FIG. 19 is a graph showing the measured magnetoresistance ratio of the magnetic memory device in Example 1.

FIG. 19 shows the measurement result of magnetoresistance ratio of the magnetic memory device prepared as above. In the magnetic field range from 2 kA/m to 6 kA/m, the magnetization became antiparallel, and the obtained magnetoresistance ratio was as high as about 5.9%.

[EXAMPLE 2]

The layers were formed in lamination successively on glass substrate 1, as shown in FIG. 14, in the order of an $Ni_{50}O_{50}$ layer of 10 nm thick as antiferromagnetic layer 2, a $Co_{90}Fe_{10}$ layer of 3 nm thick as first ferromagnetic layer 3, a Cu layer of 2.4 nm thick as nonmagnetic layer 4, and an $Ni_{80}Fe_{20}$ layer of 3 nm thick as second ferromagnetic layer 5, by sputtering continuously (without breaking the vacuum). For sharp reversal of magnetization of the ferromagnetic layers, a DC magnetic field of about 6 kA/m was applied during formation of the layers in the direction parallel to the direction of detecting and recording magnetic field application to induce in-plane uniaxial magnetic anisotropy.

Figure 20:
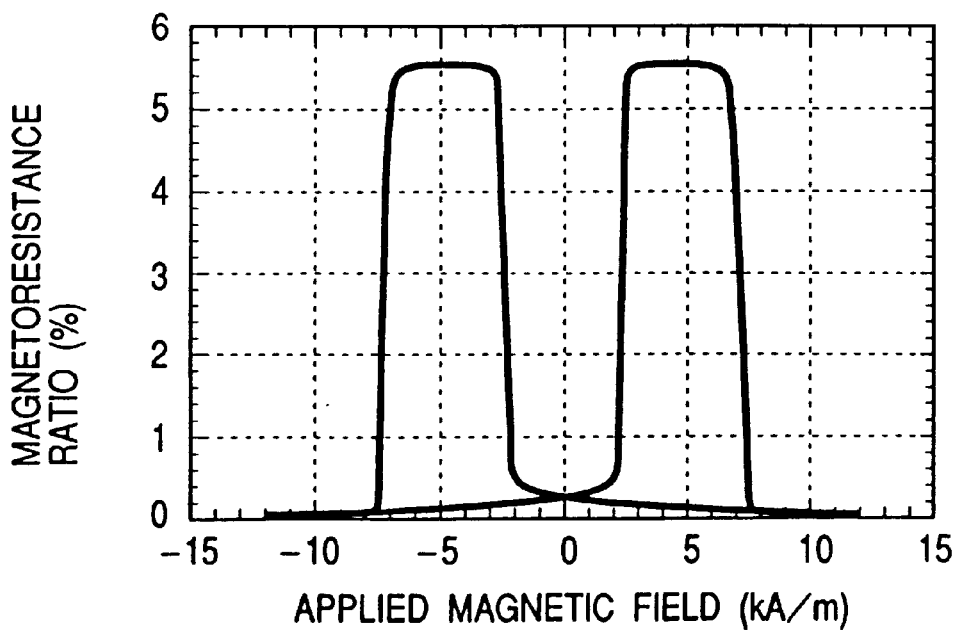
FIG. 20 is a graph showing the measured magnetoresistance ratio of the magnetic memory device in Example 2.

FIG. 20 shows the measurement result of magnetoresistance ratio of the magnetic memory device prepared as above. In the magnetic field range from 2 kA/m to 6.5 kA/m, the magnetization became antiparallel, and the obtained magnetoresistance ratio was as high as about 5.5%.

[EXAMPLE 3]

As shown in FIG. 14, on glass substrate 1, were formed an $Ni_{50}O_{50}$ layer of 15 nm thick as antiferromagnetic layer 2, a $Co_{90}Fe_{10}$ layer of 10 nm thick as first ferromagnetic layer 3, and an Al layer of 2 nm in lamination successively. Thereafter, gaseous oxygen was introduced into the chamber to oxidize this Al layer to form nonmagnetic layer 4 composed of an oxide. Then the chamber was evacuated sufficiently, and an $Ni_{80}Fe_{20}$ layer of 10 nm thick was formed as second ferromagnetic layer 5. The resulting spin tunnel film was worked into a size of 10 μm square by a lithography process, and thereon electrodes were formed by FIB to prepare a fine magnetic memory device. For sharp reversal of magnetization of the ferromagnetic layers, a DC magnetic field of about 6 kA/m was applied during formation of the respective layers in the direction parallel to the direction of detecting and recording magnetic field application to induce in-plane uniaxial magnetic anisotropy.

Figure 21:
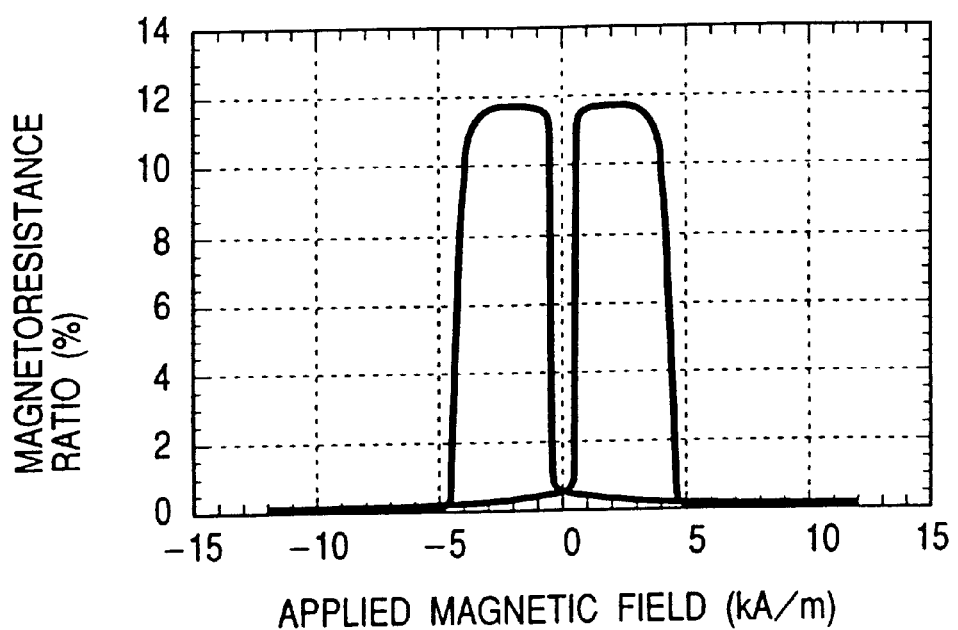
FIG. 21 is a graph showing the measured magnetoresistance ratio of the magnetic memory device in Example 3.

FIG. 21 shows the measurement result of magnetoresistance ratio of the magnetic memory device prepared as above. In the magnetic field range from 0.5 kA/m to 4 kA/m, the magnetization became antiparallel, and the obtained magnetoresistance ratio was as high as about 11.5%.

[Comparative Example 1]

The layers were formed in lamination successively on a glass substrate in the order of an $Ni_{80}Fe_{20}$ layer of 5 nm thick as a second ferromagnetic layer, a Cu layer of 2.2 nm thick as a nonmagnetic layer, a $Co_{90}Fe_{10}$ layer of 5 nm thick as a first ferromagnetic layer, and an $Ir_{50}Mn_{50}$ layer of 50 nm thick as an antiferromagnetic layer by sputtering continuously (without breaking the vacuum). For sharp reversal of magnetization of the ferromagnetic layers, a DC magnetic field of about 6 kA/m was applied during formation of the layers in the direction parallel to the direction of detecting and recording magnetic field application to induce in-plane uniaxial magnetic anisotropy.

Figure 22:
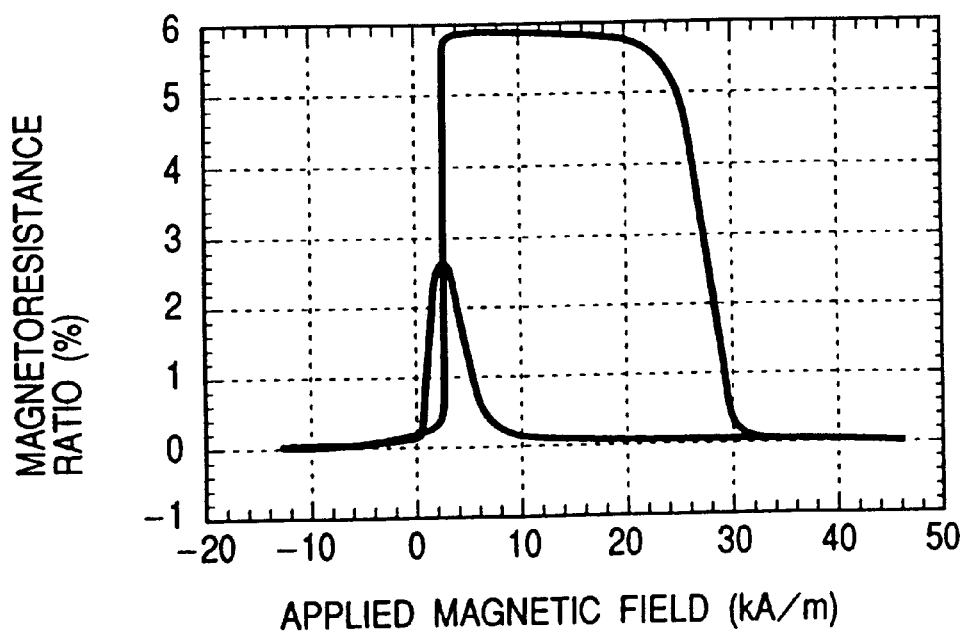
FIG. 22 is a graph showing the measured magnetoresistance ratio of the magnetic memory device in Comparative Example 1.

FIG. 22 shows the measurement result of magnetoresistance ratio of the magnetic memory device prepared as above. This magnetic memory device did not change its unidirectional anisotropy owing to the large thickness of the antiferromagnetic layer, and the magnetoresistance ratio curve was asymmetrical with respect to the Y axis.

[Comparative Example 2]

The layers were formed in lamination successively on a glass substrate in the order of a $Co_{90}Fe_{10}$ layer of 3 nm thick as a first ferromagnetic layer, a Cu layer of 2.2 nm thick as a nonmagnetic layer, and an $Ni_{80}Fe_{20}$ layer of 3 nm thick as a second ferromagnetic layer by sputtering continuously (without breaking the vacuum). For sharp reversal of magnetization of the ferromagnetic layers, a DC magnetic field of about 6 kA/m was applied during formation of the layers in the direction parallel to the direction of detecting and recording magnetic field application to induce in-plane uniaxial magnetic anisotropy.

Figure 23:
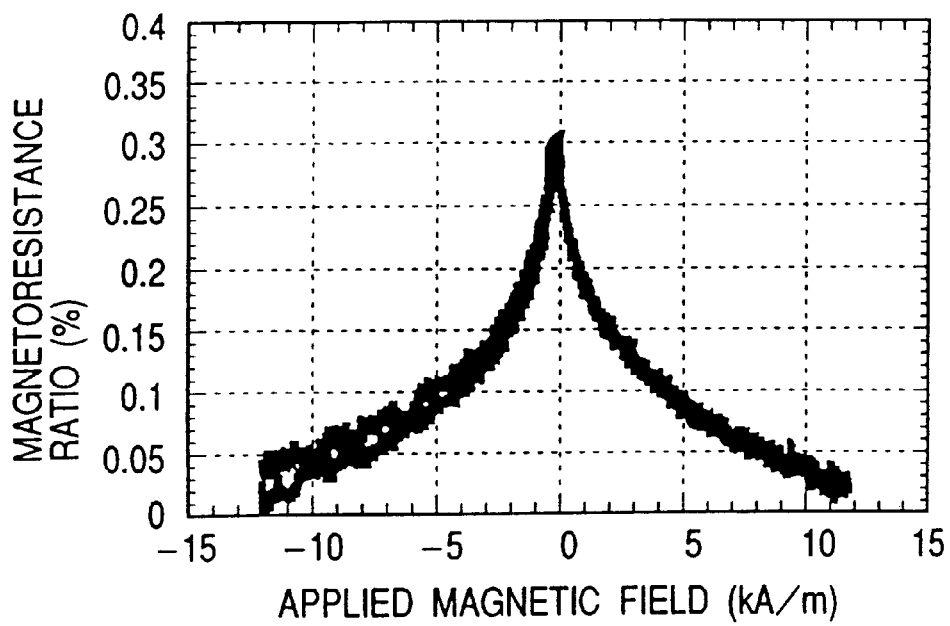
FIG. 23 is a graph showing the measured magnetoresistance ratio of the magnetic memory device in Comparative Example 2.

FIG. 23 shows the measurement result of magnetoresistance ratio of the magnetic memory device prepared as above. This magnetic memory device did not give high magnetoresistance ratio.

[Comparative Example 3]

The layers were formed in lamination successively on a glass substrate in the order of a $Co_{90}Fe_{10}$ layer of 3 nm thick as a first ferromagnetic layer, a Cu layer of 5 nm thick as a nonmagnetic layer, and an $Ni_{80}Fe_{20}$ layer of 3 nm thick as a second ferromagnetic layer, by sputtering without breaking the vacuum. For sharp reversal of magnetization of the ferromagnetic layers, a DC magnetic field of about 6 kA/m was applied during formation of the layers in the direction parallel to the direction of detecting and recording magnetic field application to induce in-plane uniaxial magnetic anisotropy.

Figure 24:
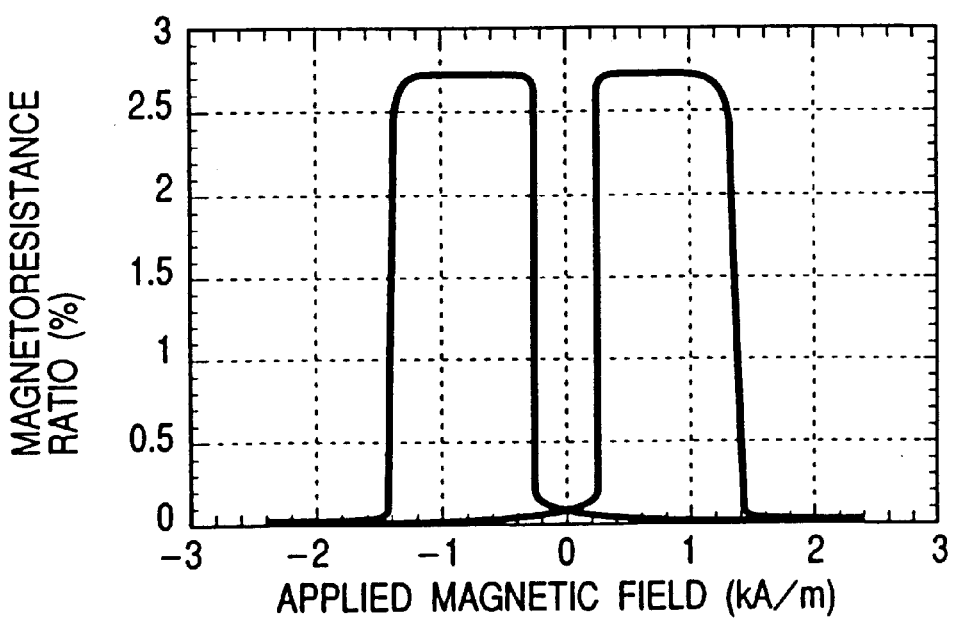
FIG. 24 is a graph showing the measured magnetoresistance ratio of the magnetic memory device in Comparative Example 3.

FIG. 24 shows the measurement result of magnetoresistance ratio of the magnetic memory device prepared as above. In the magnetic field range from 0.3 kA/m to 1.4 kA/m, the magnetization became antiparallel, but the obtained magnetoresistance ratio was as low as about 2.7% since the large thickness of the nonmagnetic metal layer decreases the proportion of the electrons participating in the magnetoresistance change.

[Comparative Example 4]

On a glass substrate, were formed a $Co_{90}Fe_{10}$ layer of 10 nm thick as first ferromagnetic layer, and an Al layer of 2 nm in lamination successively. Thereafter, gaseous oxygen was introduced into the chamber to oxidize this Al layer into a nonmagnetic layer composed of an oxide. Then the chamber was evacuated again sufficiently, and an $Ni_{80}Fe_{20}$ layer of 10 nm thick was formed as a second ferromagnetic layer. The resulting spin tunnel film was worked into a size of 10 μm square by a lithography process, and thereon electrodes were formed by FIB to prepare a fine magnetic memory device. For sharp reversal of magnetization of the ferromagnetic layers, a DC magnetic field of about 6 kA/m was applied during formation of the respective layers in the direction parallel to the direction of detecting and recording magnetic field application to induce in-plane uniaxial magnetic anisotropy.

Figure 25:
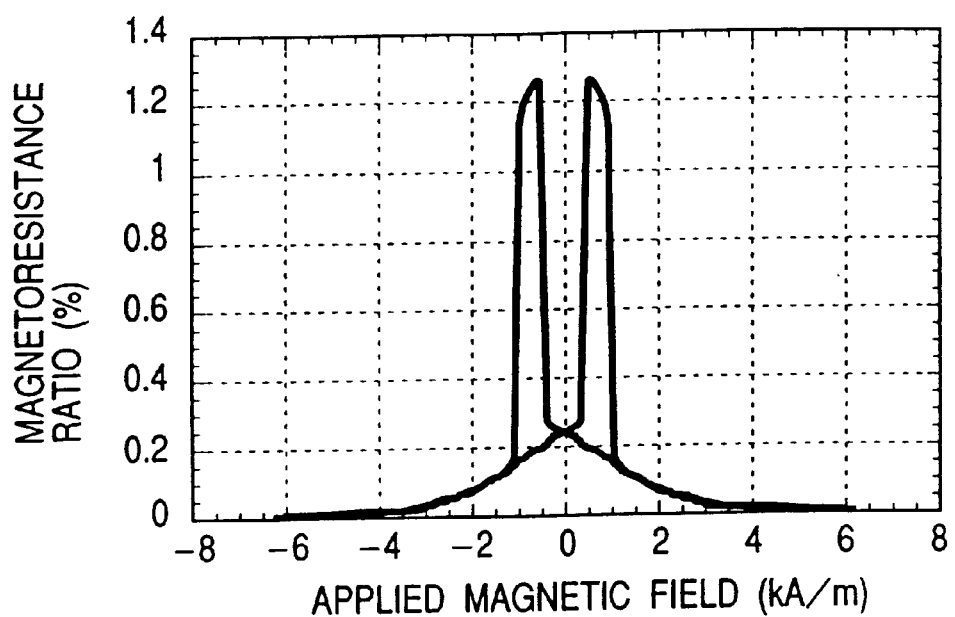
FIG. 25 is a graph showing the measured magnetoresistance ratio of the magnetic memory device in Comparative Example 4.

FIG. 25 shows the measurement result of the magnetoresistance ratio of the magnetic memory device prepared as above. The antiparallel state was insufficient, and the magnetoresistance ratio was as low as about 1.25% owing to the small difference of magnetization reversal magnetic field between the two magnetic layers.

Next, a second embodiment of the present invention is explained. In this embodiment, a second antiferromagnetic layer exchange-coupled to the second ferromagnetic layer was additionally provided in comparison with the first embodiment.

Figure 26:
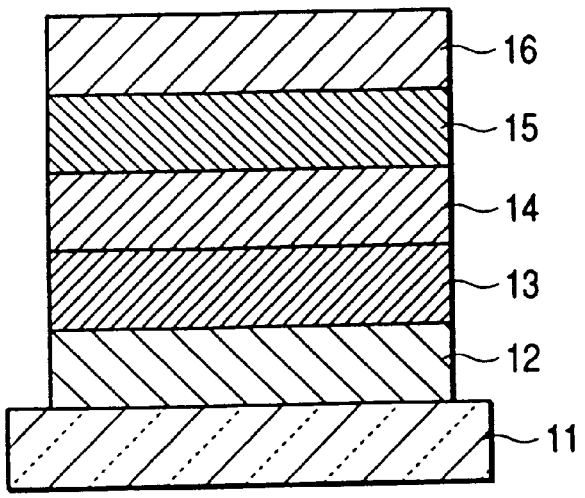
FIG. 26 is a schematic sectional view showing the layer constitution of the magnetoresistance element of the second embodiment of the present invention.

FIG. 26 is a schematic sectional view showing the layer constitution of a magnetoresistance element of the second embodiment of the present invention. In FIG. 26, the element is constituted of substrate 11, first antiferromagnetic layer 12, first ferromagnetic layer 13, nonmagnetic layer 14, second ferromagnetic layer 15, and second antiferromagnetic layer 16.

Substrate 11 is made generally from Si or glass. However, any material which is flat and durable may be used therefor without special limitation.

The antiferromagnetic layers (first antiferromagnetic layer 12 and second antiferromagnetic layer 16) may be formed from a Mn type or Cr type antiferromagnetic material such as MnFe, MnIr, MnPt, MnPtCr, and AlCr; or an oxide antiferromagnetic material such as NiO, and $\alpha$-$Fe_2O_3$, the material preferably having a Néel temperature higher than the operation temperature. In particular, magnetic memory devices employing an oxide antiferromagnetic material are expected to give high magnetoresistance ratio because of no occurrence of electron shunting in the antiferromagnetic material owing to good insulation properties thereof.

Ferromagnetic layers (first ferromagnetic layer 13, and second ferromagnetic layer 15) may be formed from Co, CoFe, Fe, NiFe, or the like. Nonmagnetic layer 14 may be formed from a nonmagnetic metal such as Cu, and $Al_2O_3$.

The reversal of the unidirectional anisotropy of antiferromagnetic layers 12, 16 is caused through magnetization of ferromagnetic layers 13, 15 exchange-coupling thereto. Specifically, in a state that the direction of the unidirectional anisotropy of antiferromagnetic layers 12, 16 and the direction of magnetization of ferromagnetic layers 13, 15 are parallel to each other, the magnetization of first ferromagnetic layers 13 and 15 is reversed by applying an external magnetic field in an antiparallel direction from the outside to the layers, and then the magnetic moment of atoms of antiferromagnetic layers 12 and 16 exchange-coupled thereto which atoms exist in an interface between the ferromagnetic layer and the antiferromagnetic layer is reversed, and then the magnetic moment of atoms in antiferromagnetic layers 12 and 16 which atoms are distant from the interface is reversed by the interaction, successively. Thus the unidirectional anisotropy of antiferromagnetic layers 12, 16 is reversed.

The coercivity of ferromagnetic layers 13, 15 in this embodiment varies depending on the thickness of ferromagnetic layers 13, 15, the exchange-coupling field between ferromagnetic layers 13, 15 and antiferromagnetic layers 12, 16, and the thickness of antiferromagnetic layers 12, 16. In particular, the coercivity can readily be adjusted by selecting the thickness of ferromagnetic layers 13, 15 or of antiferromagnetic layers 12, 16.

Figure 27:
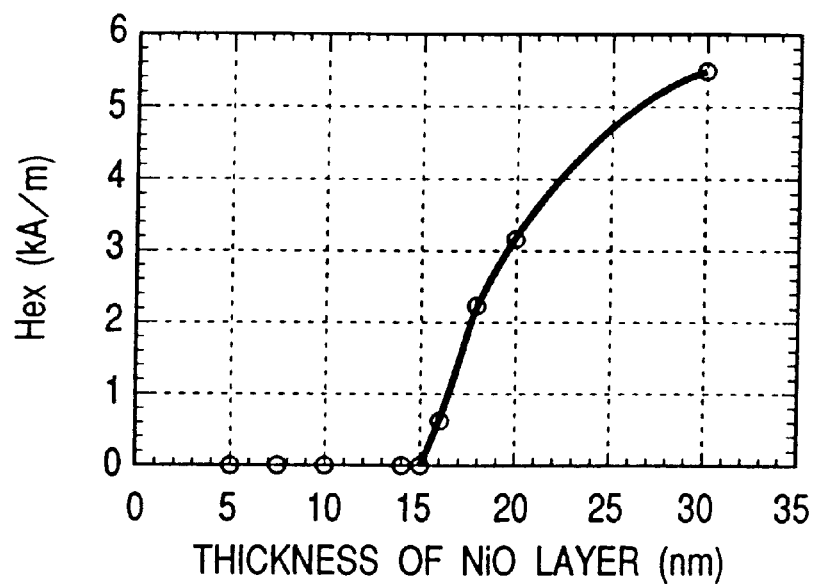
FIG. 27 is a graph showing dependence of the exchange-coupling magnetic field Hex on the thickness of NiO layer as the antiferromagnetic layer.

For example, the coercivity varies depending on the layer thickness of the ferromagnetic layer as shown above with FIG. 16. The coercivity of the ferromagnetic layer having a fixed thickness varies depending on the thickness of the antiferromagnetic layer as explained with FIG. 17. With a larger thickness of the antiferromagnetic layer, the unidirectional anisotropy of the antiferromagnetic layer will not be reversed, and the magnetization curve or the magnetoresistance curve shifts in the magnetic field direction. FIG. 27 is a graph showing dependence of the shift in the magnetic field direction, namely exchange-coupling magnetic field $H_{ex}$, on the thickness of the NiO layer as an antiferromagnetic layer. In this measurement, the thickness of the CoFe layer as the ferromagnetic layer of the sample is kept unchanged at 5 nm.

For reversing the unidirectional anisotropy of the antiferromagnetic layer, the thickness of the antiferromagnetic layer is selected not to accumulate the exchange energy in the antiferromagnetic layer. The layer thickness therefor depends on the material and construction of the antiferromagnetic layer.

Figure 28:
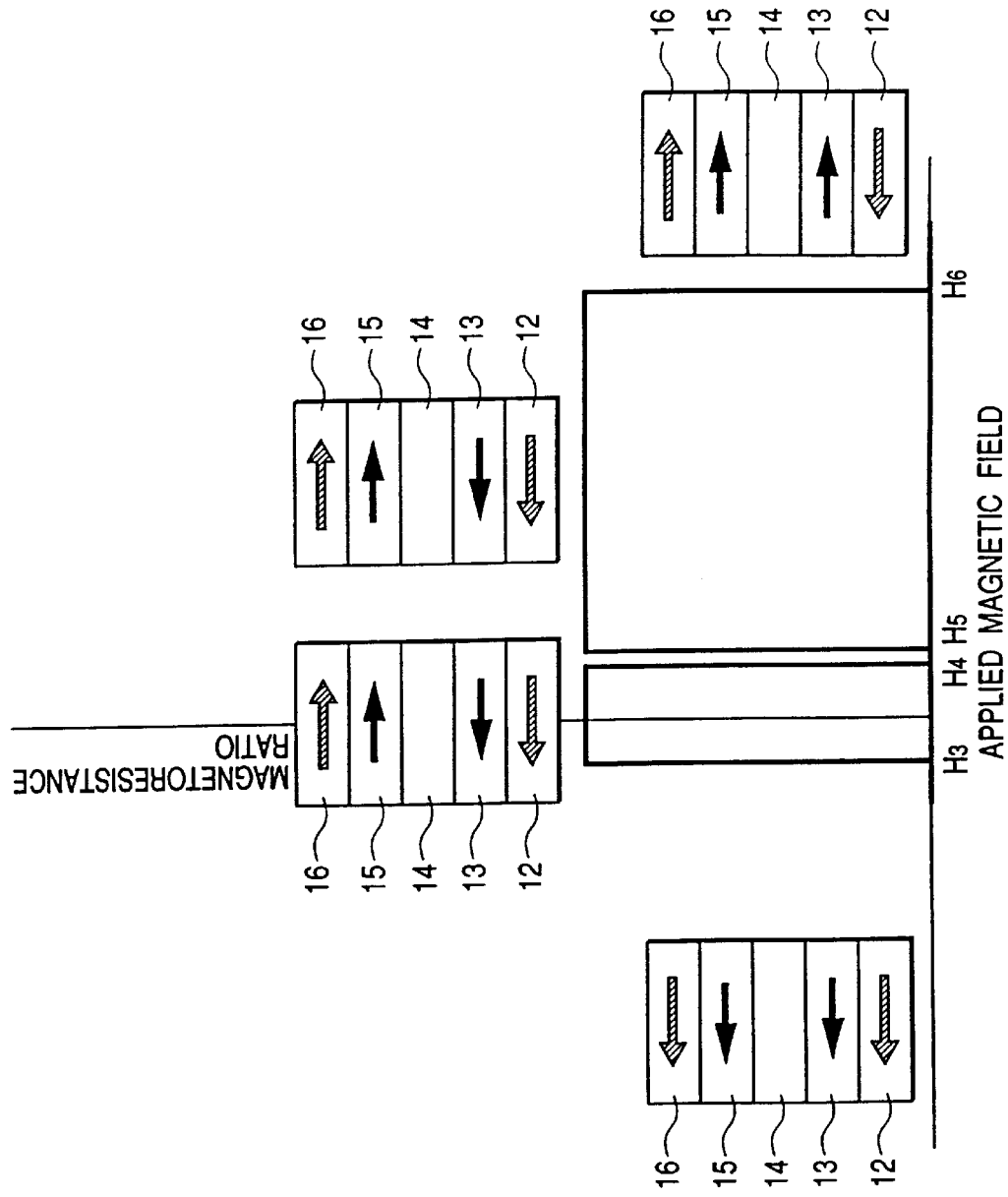
FIG. 28 includes a graph showing relation between the applied magnetic field and the magnetoresistance ratio, and a schematic diagram showing the change of the magnetization direction of the ferromagnetic layer and the change of direction of unidirectional anisotropy of the antiferromagnetic layer for the magnetoresistance element of the second embodiment of the present invention.

FIG. 28 includes a graph showing relation between the applied magnetic field and the magnetoresistance ratio of the magnetoresistance element of FIG. 26, and a schematic diagram showing the magnetization direction of ferromagnetic layers 13, 15 and the change of direction of unidirectional anisotropy of antiferromagnetic layers 12, 16. FIG. 28 shows the state of shift of the magnetization loop of first ferromagnetic layer 13 out of two ferromagnetic layers 13, 15. In FIG. 28, the same symbols as in FIG. 26 are used for the corresponding members.

In the initial state, the applied magnetic field H is in the range of $H<H_3$. In this initial state, the directions of magnetization and the direction of the unidirectional anisotropy of the layers 12, 13, 15, 16 are all parallel to the applied magnetic field as shown at the left end of FIG. 28. When the applied magnetic field is changed to be in the range of $H_5<H<H_6$, the magnetization of second ferromagnetic layer 15 and the unidirectional anisotropy of second antiferromagnetic layer 16 are reversed to make the magnetization directions of first ferromagnetic layer 13 and second ferromagnetic layer 15 antiparallel, increasing the resistivity.

The intensity $H_5$ is equal to $H_{c2}+H_{ex2}+H_s$, where $H_{c2}$ is inherent coercivity of second ferromagnetic layer 15, $H_{ex2}$ is exchange-coupling magnetic field exerting between second ferromagnetic layer 15 and second antiferromagnetic layer 16, and $H_s$ is the magnetostatic coupling field exerting between first ferromagnetic layer 13 and second ferromagnetic layer 15. In this example, $H_s$ serves to parallelize the magnetization of first ferromagnetic layer 13 and the magnetization of second ferromagnetic layer 15.

By intensifying the magnetic field H applied to be in the range of $H_6<H$, the magnetization of first ferromagnetic layer 13 is reversed to lower the resistivity again. $H_6$ is equal to $H_{c1}+H_{ex1}-H_s$, where $H_{c1}$ is the inherent coercivity of first ferromagnetic layer 13, $H_{ex1}$ is exchange-coupling magnetic field exerting between first ferromagnetic layer 13 and first antiferromagnetic layer 12. By reducing the applied magnetic field H further to be in the range of $H_3<H<H_4$, the magnetization of first ferromagnetic layer 13 and the unidirectional anisotropy of first antiferromagnetic layer 12 are reversed. By changing the applied magnetic field H to be in the range of $H<H_3$, the system returns to the initial state. $H_4$ is equal to $-H_{c1}+H_{ex1}-H_s$. $H_3$ is the magnetic field where the magnetization of the second ferromagnetic layer and the unidirectional anisotropy of the second antiferromagnetic layer are reversed, and is equal to $-H_{c2}+H_{ex2}+H_s$.

In FIG. 28, the magnetization becomes antiparallel in the magnetic field range of also $H_3<H<H_4$. However, this is not always true. At a certain magnetic field application, the both magnetization states of ferromagnetic layers 13, 15 is reversed simultaneously from a right-directed state to a left-directed state. In such a case, the magnetoresistance change is not caused in the magnetic field range of $H_3<H<H_4$. Whether the magnetization states are simultaneously reversed or not depends on the energy balance.

In application of the magnetoresistance element of the present invention as a memory device, first ferromagnetic layer 13 is not reversed, and the data of "0" and "1" are recorded by magnetization direction of second ferromagnetic layer 15. Therefore, in the memory device, the magnetoresistance is raised by $H_5$ from the initial state of $H<H_3$, and the magnetic field is reduced at the magnetic field of less than $H_6$ to return to the initial state to form a loop.

In the above change, in case that the size of the magnetic layer is reduced, a curling of the magnetization caused at an end face of the magnetic layer becomes noticeable, thereby the recording may not be able to be carried out. However, in such a case, the magnetization is stored sufficiently stably since the direction of the unidirectional anisotropy in second antiferromagnetic layer 16 is parallel invariably to the direction of the magnetization in second ferromagnetic layer 15.

In this embodiment, of the two exchange-coupled films constituted of a ferromagnetic layer and an antiferromagnetic layer, the one employed as the memory layer has a ferromagnetic layer magnetized in the direction parallel to the corresponding unidirectional anisotropy of the antiferromagnetic layer. Therefore, the magnetization is stored extremely stably. Herein, the description "the memory layer has a ferromagnetic layer magnetized in the direction parallel to the corresponding unidirectional anisotropy of the antiferromagnetic layer" means that the parallel state is maintained under conditions of recording, reproduction, and other usual operations.

The magnetoresistance element of this embodiment is especially useful as magnetic memory devices, in particular spin-scatter type or spin-tunnel type of magnetoresistance memory device used in a manner shown in FIG. 28, but is not limited thereto in application thereof.

The second embodiment of the present invention is described in more detail by reference to examples.

[EXAMPLE 4]

As shown in FIG. 26, on glass substrate 11, were formed an $Ir_{30}Mn_{70}$ layer of 20 nm thick as first antiferromagnetic layer 12, a $Co_{90}Fe_{10}$ layer of 10 nm thick as first ferromagnetic layer 13, and an Al layer of 2 nm in lamination successively. Thereafter, gaseous oxygen was introduced into the chamber to oxidize the Al layer to form nonmagnetic layer 14 composed of an oxide. Then the chamber was evacuated again sufficiently, and a $Co_{90}Fe_{10}$ layer of 10 nm thick as second ferromagnetic layer 15, and an $Ir_{30}Mn_{70}$ layer of 3 nm thick as second antiferromagnetic layer 16 were formed. For sharp reversal of magnetization of the ferromagnetic layers, a DC magnetic field of about 6 kA/m was applied during formation of the respective layers in the direction parallel to the direction of detecting and recording magnetic field application to induce in-plane uniaxial magnetic anisotropy.

The resulting spin-tunnel film was worked into a size of 0.8 μm square by FIB, and thereon electrodes were formed for measurement of the voltage by flowing electric current between first ferromagnetic layer 13 and second ferromagnetic layer 15 to complete a magnetic memory device.

[EXAMPLE 5]

The layers were formed in lamination successively on glass substrate 11, as shown in FIG. 26, in the order of an $Ni_{50}O_{50}$ layer of 50 nm thick as first antiferromagnetic layer 12, a $Co_{90}Fe_{10}$ layer of 2 nm thick as first ferromagnetic layer 13, a Cu layer of 2.2 nm thick as nonmagnetic layer 14, a $Co_{90}Fe_{10}$ layer of 4 nm thick as second ferromagnetic layer 15, and an $Ni_{50}O_{50}$ layer of 8 nm thick as second antiferromagnetic layer 16, by sputtering continuously (without breaking the vacuum). During formation of the layers, a DC magnetic field was applied in the same manner as in Example 4 to induce in-plane uniaxial magnetic anisotropy.

The obtained spin scatter film was processed by FIB to 0.8 μm square size. An electrode was then formed on a side face of the film to enable a current to be passed in the in-plane direction of the film. The magnetic memory device thus was fabricated.

[Comparative Example 5]

The layers were formed successively in lamination on a glass substrate in the order of an $Mn_{50}Fe_{50}$ layer of 40 nm thick as a first antiferromagnetic layer, a $Co_{90}Fe_{10}$ layer of 3 nm thick as a first ferromagnetic layer, a Cu layer of 5 nm thick as a nonmagnetic layer, and an $Ni_{80}Fe_{20}$ layer of 3 nm thick as a second ferromagnetic layer by sputtering without breaking the vacuum. During formation of the layers, a DC magnetic field was applied in the same manner as in Example 4 to induce in-plane uniaxial magnetic anisotropy. With the obtained spin scatter film, a magnetic memory device was prepared in the same manner as in Example 4.

[Comparative Example 6]

On a glass substrate, were formed an $Ni_{50}O_{50}$ layer of 50 nm thick as a first antiferromagnetic layer, a $Co_{90}Fe_{10}$ layer of 10 nm thick as a first ferromagnetic layer, and an Al layer of 2 nm successively in lamination. Thereafter, gaseous oxygen was introduced into the chamber to oxidize this Al layer to form a nonmagnetic layer composed of an oxide. Then the chamber was evacuated again sufficiently, and an $Ni_{80}Fe_{20}$ layer of 10 nm thick was formed as a second ferromagnetic layer. During formation of the respective layers, a DC magnetic field was applied in the same manner as in Example 4 to induce in-plane uniaxial magnetic anisotropy. With the resulting spin tunnel film, a magnetic memory device was prepared in the same manner as in Example 4.

[Comparative Example 7]

The layers were formed successively in lamination on a glass substrate in the order of an $Ni_{50}O_{50}$ layer of 50 nm thick as a first antiferromagnetic layer, a $Co_{90}Fe_{10}$ layer of 2 nm thick as a first ferromagnetic layer, a Cu layer of 2.2 nm thick as a nonmagnetic layer, and a $Co_{90}Fe_{10}$ layer of 4 nm thick as second ferromagnetic layer by sputtering without breaking the vacuum. During formation of the respective layers, a DC magnetic field was applied in the same manner as in Example 4 to induce in-plane uniaxial magnetic anisotropy. With the resulting spin scatter film, a magnetic memory device was prepared in the same manner as in Example 5.

The magnetic memory devices prepared in Examples 4 to 5 and Comparative Examples 5 to 7 were subjected to measurement for the magnetic field range for antiparallel magnetization, and for the magnetoresistance ratio. Table 1 summarizes the measurement results. The magnetoresistance ratio was measured by the DC four-probe method.

TABLE 1

|  | Antiparallel magnetization range (kA/m) | Magneto-resistance change rate (%) |
| --- | --- | --- |
| Example 4 | 7.3 to 45.1 | 13.3 |
| Example 5 | 3.2 to 20.8 | 8.0 |
| Comparative Example 5 | 0.3 to 34.0 | 2.5 |

TABLE 1-continued

|  | Antiparallel magnetization range (kA/m) | Magneto- resistance change rate (%) |
| --- | --- | --- |
| Comparative Example 6 | 15.5 to 16.9 | 0.7 |
| Comparative Example 7 | None | No change |

Figure 29:
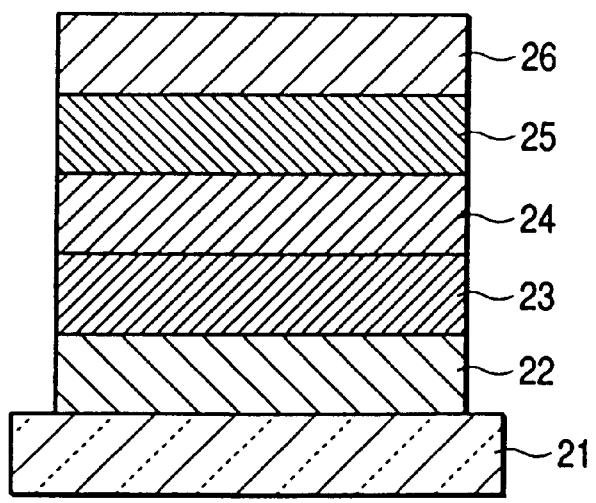
FIG. 29 is a schematic sectional view showing the layer constitution of a magnetoresistance element of the third embodiment of the present invention.

A third embodiment of the present invention is described below. FIG. 29 is a schematic sectional view showing the basic layer constitution of a magnetoresistance element of the third embodiment of the present invention. In FIG. 29, the element is constituted of substrate 21, first antiferromagnetic layer 22, first ferromagnetic layer 23, nonmagnetic layer 24, second ferromagnetic layer 25, and second antiferromagnetic layer 26.

Substrate 21 is made generally from Si or glass. However, any material which is flat and durable may be used therefor without special limitation.

The antiferromagnetic layers (first antiferromagnetic layer 22 and second antiferromagnetic layer 26) may be formed from an Mn type or Cr type antiferromagnetic material such as MnFe, MnIr, MnPt, MnPtCr, and AlCr; or an oxide antiferromagnetic material such as NiO, and $\alpha$-$Fe_2O_3$, the material having preferably a Néel temperature higher than the operation temperature. In particular, magnetic memory devices employing an oxide antiferromagnetic material are expected to give high magnetoresistance ratio because of no occurrence of electron shunting in the antiferromagnetic material owing to good insulation properties thereof.

Ferromagnetic layers (first ferromagnetic layer 23 and second ferromagnetic layer 25) may be formed from Co, CoFe, Fe, NiFe, or the like. Nonmagnetic layer 24 may be formed from a nonmagnetic metal such as Cu, and $Al_2O_3$.

The reversal of the unidirectional anisotropy of antiferromagnetic layers 22, 26 is caused through magnetization of ferromagnetic layers 23, 25 exchange-coupling thereto. Specifically, in a state that the direction of the unidirectional anisotropy of antiferromagnetic layers 22, 26 and the direction of magnetization of ferromagnetic layers 23, 25 are parallel to each other, the magnetization of first ferromagnetic layers 23 and 25 is reversed by applying an external magnetic field in an antiparallel direction from the outside to the layers, and then the magnetic moment of atoms of antiferromagnetic layers 22 and 26 exchange-coupled thereto which atoms exist in an interface between the ferromagnetic layer and the antiferromagnetic layer is reversed, and then the magnetic moment of atoms in antiferromagnetic layers 22 and 26 which atoms are distant from the interface is reversed by the interaction, successively. Thus the unidirectional anisotropy of antiferromagnetic layers 22, 26 is reversed.

The coercivity of ferromagnetic layers 23, 25 in this embodiment varies depending on the thickness of ferromagnetic layers 23, 25, the exchange-coupling field between ferromagnetic layers 23, 25 and antiferromagnetic layers 22, 26, and the thickness of antiferromagnetic layers 22, 26. In particular, the coercivity can readily be adjusted by selecting the thickness of ferromagnetic layers 23, 25 or of antiferromagnetic layers 22, 26.

For example, the coercivity varies depending on the layer thickness of the ferromagnetic layer as shown above with FIG. 16. The coercivity of the ferromagnetic layer having a fixed thickness varies depending on the thickness of the antiferromagnetic layer as explained by reference to FIG. 17. With a larger thickness of the antiferromagnetic layer, the unidirectional anisotropy of the antiferromagnetic layer will not be reversed, and the magnetization curve or the magnetoresistance curve shifts in the magnetic field direction. The dependence of the shift in the magnetic field direction, namely exchange-coupling magnetic field $H_{ex}$, on the thickness of the NiO layer as an antiferromagnetic layer is described before by reference to FIG. 27.

For reversing the unidirectional anisotropy of the antiferromagnetic layer, the thickness of the antiferromagnetic layer is selected not to accumulate the exchange energy in the antiferromagnetic layer. The layer thickness therefor depends on the material and construction of the antiferromagnetic layer.

Figure 30:
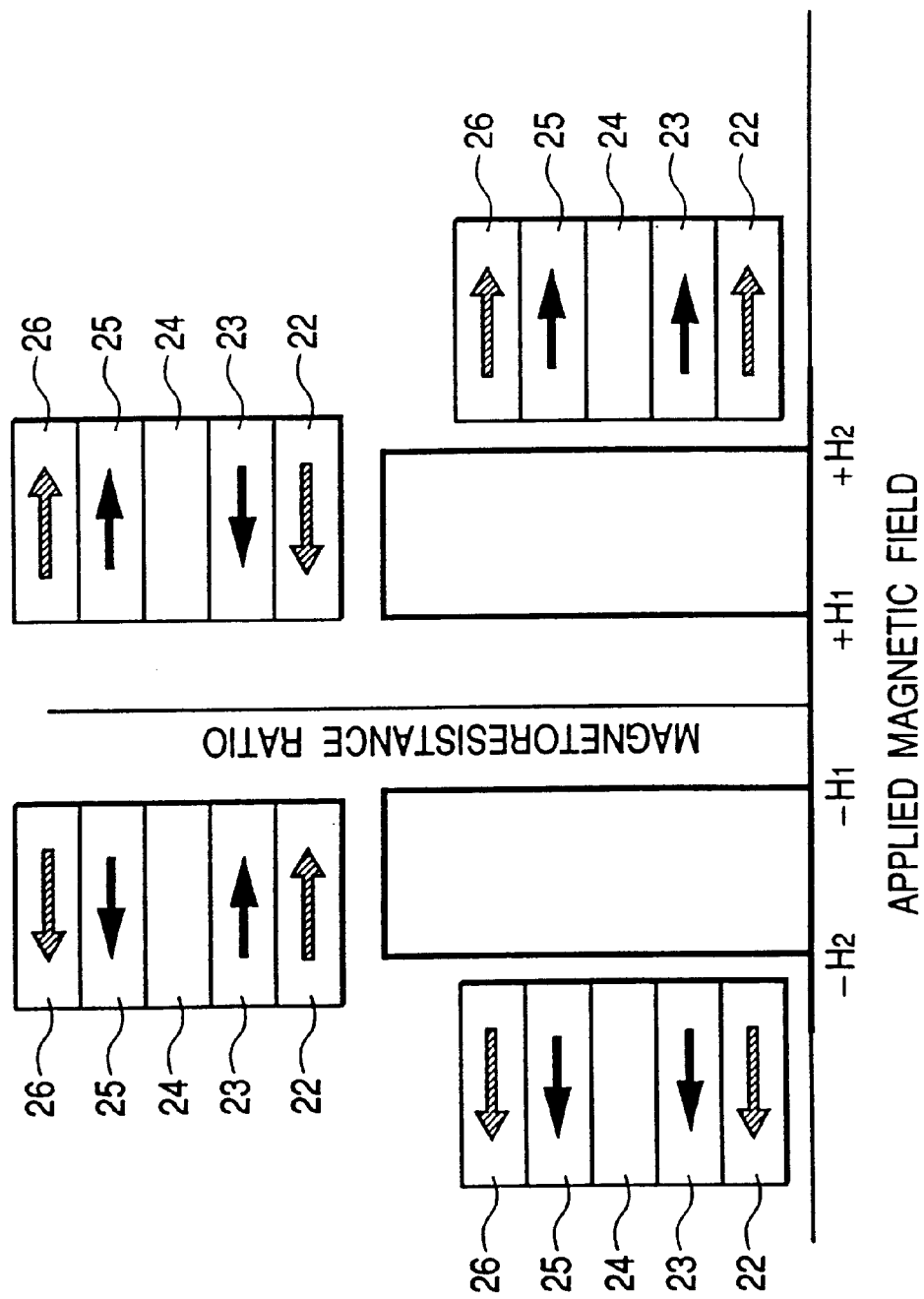
FIG. 30 includes a graph showing relation between the applied magnetic field and the magnetoresistance ratio, and a schematic diagram showing the magnetization direction of the ferromagnetic layer and the change of direction of unidirectional anisotropy of the antiferromagnetic layer for the magnetoresistance element of the third embodiment of the present invention.

FIG. 30 includes a graph showing relation between the applied magnetic field and the magnetoresistance ratio of the magnetoresistance element of FIG. 29, and a schematic diagram showing the magnetization direction of ferromagnetic layers 23, 25 and the change of direction of unidirectional anisotropy of antiferromagnetic layers 22, 26. In FIG. 30, the same symbols as in FIG. 29 are used for the corresponding members.

In the initial state, the applied magnetic field H is in the range of $H<-H_2$. In this initial state, the directions of magnetization and the direction of the unidirectional anisotropy of the layers 22, 23, 25, 26 are all parallel to the applied magnetic field as shown at the left end of FIG. 30. When the applied magnetic field is changed to be in the range of $+H_1<H<+H_2$, the magnetization of second ferromagnetic layer 25 having relatively low coercivity is reversed to make the magnetization directions of first ferromagnetic layer 23 and second ferromagnetic layer 25 antiparallel, increasing the resistivity. The intensity $+H_1$ is equal to $H_{c2}+H_{ex2}+H_s$, where $H_{c2}$ is the inherent coercivity of second ferromagnetic layer 25, $H_{ex2}$ is the exchange-coupling field exerting to antiferromagnetic layer 26, and $H_s$ is the magnetostatic coupling field exerting between two ferromagnetic layers 23, 25.

Further, when the applied magnetic field is intensified to be $+H_2<H$, the magnetization of first ferromagnetic layer 23 is reversed to lower the resistivity of the magnetoresistance effect film again. The intensity $+H_2$ is equal to $H_{c1}+H_{ex1}-H_s$, where $H_{c1}$ is the inherent coercivity of first ferromagnetic layer 23, and $H_{ex1}$ is the exchange-coupling field exerting to first antiferromagnetic layer 22.

Then, by making the applied magnetic field amount to the range of $-H_2<H<-H_1$, the magnetization of second ferromagnetic layer 25 is reversed. Further, by changing the applied magnetic field to be $H<-H_2$, the system returns to the initial state.

In application of the magnetoresistance element of this embodiment as a memory device, of the two "ferromagnetic layer/antiferromagnetic layer" exchange-coupling films, the one having a higher coercivity is employed as the memory layer, whereas the other one having a lower coercivity is employed as the detection layer. In the case of FIG. 30, the coercivity of the memory layer is $H_2$, and the coercivity of the detection layer is $H_1$. For example, on application of a magnetic field of $H_2$ or stronger (recording magnetic field: Hw) in a + (positive) direction, the magnetization and the unidirectional anisotropy are directed to the + direction. This state is employed as the recording of "1". On the other hand, on application of a recording magnetic field Hw in a −

(negative) direction, the magnetization and the unidirectional anisotropy are directed to the − direction. This state is employed as the recording of "0".

For example, when a detecting magnetic field stronger the $H_1$ but weaker than $H_2$ is applied to a memory device in a state of recording "1" in a + direction (detecting magnetic field: Ha), the reversal of magnetization is not caused with the magnetization of the memory layer and the detection layer kept parallel, with the memory device exhibiting a low resistance. Then, on application of the detecting magnetic field Ha in a − direction thereto, the magnetization and the unidirectional anisotropy are reversed to make the magnetization of the memory layer and of the detection layer antiparallel to each other, resulting in high resistance of the memory layer. In other word, when the detecting magnetic field Ha is applied continuously from the + direction to the − direction, the resistivity is increasing. Therefore, by detecting this change of the resistivity, "1" can be detected. Similarly, the record "0" can be detected by applying the detecting magnetic field Ha from the + direction to the − direction and detecting the change of the resistivity.

In this embodiment, the ferromagnetic layer having a lower coercivity is utilized as the detection layer, and the other ferromagnetic layer having a higher coercivity is utilized as the memory layer. The unidirectional anisotropy of first antiferromagnetic layer 22 and the magnetization of first ferromagnetic layer 23 are in a parallel direction, and the unidirectional anisotropy of second antiferromagnetic layer 26 and the magnetization of second ferromagnetic layer 25 are in a parallel direction. Therefore, the coercivity of the ferromagnetic layers for the memory layer and the detection layer can be raised. Thereby, the memory layer can be made finer with a stable magnetization direction, and the intended coercivity can readily be obtained by adjusting the thickness of the ferromagnetic layer and of the antiferromagnetic layer. Further, the difference in the coercivity can readily be made larger between the memory layer and the detection layer, so that the antiparallel state of the magnetization of the memory layer and of the detection layer can be stabilized even with a smaller thickness of the nonmagnetic layer. Herein, the parallel state of the direction of magnetization of the ferromagnetic layer and the direction of unidirectional anisotropy of the antiferromagnetic layer is meant to be kept under ordinary conditions of recording, reproduction, and other operations.

The magnetoresistance element of this embodiment is especially useful for magnetic memory devices, in particular spin-scatter type or spin-tunnel type of magnetoresistance memory device used in a manner shown in FIG. 30, but is not limited thereto not limited in application thereof.

The third embodiment of the present invention is described in more detail by reference to examples.

[EXAMPLE 6]

The layers were formed in lamination successively on glass substrate 21, as shown in FIG. 29, in the order of an $Ir_{30}Mn_{70}$ layer of 3 nm thick as first antiferromagnetic layer 22, a $Co_{90}Fe_{10}$ layer of 10 nm thick as first ferromagnetic layer 23, a Cu layer of 2.2 nm thick as nonmagnetic layer 24, a $Co_{90}Fe_{10}$ layer of 2 nm thick as second ferromagnetic layer 25, and an $Ir_{30}Mn_{70}$ layer of 3 nm thick as second antiferromagnetic layer 26, by sputtering without breaking the vacuum.

For sharp reversal of magnetization of the ferromagnetic layers, a DC magnetic field of about 6 kA/m was applied during formation of the respective layers in the direction parallel to the direction of detecting and recording magnetic field application to induce in-plane uniaxial magnetic anisotropy. The obtained spin scatter film was processed by FIB to 0.8 μm square size. An electrode was then formed on a side face of the film to enable a current to be passed in the in-plane direction of the film. The magnetic memory device thus was fabricated.

[EXAMPLE 7]

The layers were formed in lamination successively on glass substrate 21, as shown in FIG. 29, in the order of an $Ni_{50}O_{50}$ layer of 5 nm thick as first antiferromagnetic layer 22, a $Co_{90}Fe_{10}$ layer of 3 nm thick as first ferromagnetic layer 23, a Cu layer of 2.2 nm thick as nonmagnetic layer 24, a $Co_{90}Fe_{10}$ layer of 3 nm thick as second ferromagnetic layer 25, and an $Ni_{50}O_{50}$ layer of 10 nm thick as second antiferromagnetic layer 26, by sputtering continuously without breaking the vacuum.

During formation of the respective layers, a DC magnetic field was applied in the same manner as in Example 6 to induce in-plane uniaxial magnetic anisotropy. The obtained spin scatter film was processed by FIB to 0.8 μm square size. An electrode was then formed on a side face of the film to enable a current to be passed in the in-plane direction of the film. The magnetic memory device thus was fabricated.

[EXAMPLE 8]

As shown in FIG. 29, on glass substrate 21, were formed an $Ni_{50}O_{50}$ layer of 15 nm thick as first antiferromagnetic layer 22, a $Co_{90}Fe_{10}$ layer of 10 nm thick as first ferromagnetic layer 23, and an Al layer of 2 nm in lamination successively. Thereafter, gaseous oxygen was introduced into the chamber to oxidize the Al layer to form nonmagnetic layer 24 composed of an oxide. Then the chamber was evacuated again sufficiently, and a $Co_{90}Fe_{10}$ layer of 10 nm thick as second ferromagnetic layer 25, and an $Ni_{50}O_{50}$ layer of 5 nm thick as second antiferromagnetic layer 26 were formed. During formation of the respective layers, a DC magnetic field was applied in the same manner as in Example 6 to induce in-plane uniaxial magnetic anisotropy.

The resulting spin tunnel film was worked into a size of 0.8 μm square by FIB, and thereon electrodes were formed for measurement of the voltage by flowing electric current between first ferromagnetic layer 23 and second ferromagnetic layer 25, thereby completing a magnetic memory device.

[Comparative Example 8]

The layers were formed successively in lamination on a glass substrate in the order of a $Co_{90}Fe_{10}$ layer of 10 nm thick as a first ferromagnetic layer, a Cu layer of 2.2 nm thick as a nonmagnetic layer, a $Co_{90}Fe_{10}$ layer of 5 nm thick as second ferromagnetic layer, and an $Ir_{30}Mn_{70}$ layer of 50 nm thick as an antiferromagnetic layer by sputtering without breaking the vacuum. During formation of the layers, a DC magnetic field was applied in the same manner as in Example 6 to induce in-plane uniaxial magnetic anisotropy. The obtained spin scatter film was processed by FIB to 0.8 μm square size. An electrode was then formed on a side face of the film to enable a current to be passed in the in-plane direction of the film. The magnetic memory device thus was fabricated.

[Comparative Example 9]

The layers were formed successively in lamination on a glass substrate in the order of a $Co_{90}Fe_{10}$ layer of 3 nm thick as a first ferromagnetic layer, a Cu layer of 2.2 nm thick as a nonmagnetic layer, a $Co_{90}Fe_{10}$ layer of 3 nm thick as a second magnetic layer, and an $Ni_{50}O_{50}$ layer of 10 nm thick as an antiferromagnetic layer by sputtering continuously (without breaking the vacuum). During formation of the layers, a DC magnetic field was applied in the same manner as in Example 6 to induce in-plane uniaxial magnetic anisotropy. The obtained spin scatter film was processed by FIB to 0.8 μm square size. An electrode was then formed on a side face of the film to enable a current to be passed in the in-plane direction of the film. The magnetic memory device thus was fabricated.

[Comparative Example 10]

On a glass substrate, were formed in lamination a $Co_{90}Fe_{10}$ layer of 10 nm thick as a first ferromagnetic layer, and an Al layer of 2 nm successively. Thereafter, gaseous oxygen was introduced into the chamber to oxidize the Al layer to form a nonmagnetic oxide. Then the chamber was evacuated again sufficiently, a $Co_{90}Fe_{10}$ layer of 10 nm thick as a second ferromagnetic layer, and an $Ni_{50}O_{50}$ layer of 5 nm thick as an antiferromagnetic layer was formed thereon. During formation of the respective layers, a DC magnetic field was applied in the same manner as in Example 6 to induce in-plane uniaxial magnetic anisotropy. The obtained spin tunnel film was processed by FIB to 0.8 μm square size. An electrode was then formed to enable a voltage to be measured by passing a current between the first magnetic layer and the second magnetic layer. The magnetic memory device thus was fabricated.

The magnetic memory devices prepared in Examples 6 to 8 and Comparative Examples 8 to 10 were subjected to measurement for the magnetic field range for antiparallel magnetization, and the magnetoresistance ratio. Table 2 summarizes the measurement results. The magnetoresistance ratio was measured by the DC four-probe method.

TABLE 2

|  | Antiparallel magnetization range (kA/m) | Magneto-resistance change rate (%) |
| --- | --- | --- |
| Example 6 | ±7.2 to ±12.6 | 8.2 |
| Example 7 | ±3.3 to ±6.9 | 9.7 |
| Example 8 | ±1.0 to ±3.1 | 7.5 |
| Comparative Example 8 | None | No change |
| Comparative Example 9 | None | No change |
| Comparative Example 10 | None | No change |

What is claimed is:

1. A magnetoresistance element comprising a substrate,
   a first ferromagnetic layer formed on the substrate,
   a second ferromagnetic layer formed in lamination on the first ferromagnetic layer,
   a nonmagnetic layer formed between the first and second ferromagnetic layers, and
   an antiferromagnetic layer exchange-coupled to the first ferromagnetic layer,
   wherein the direction of unidirectional anisotropy of the antiferromagnetic layer is parallel to the magnetization direction of the first ferromagnetic layer, and
   wherein the unidirectional anisotropy of the antiferromagnetic layer may reverse with a reverse of magnetization of the first ferromagnetic layer.

2. The magnetoresistance element according to claim 1, wherein the nonmagnetic layer comprises a nonmagnetic metal layer.

3. The magnetoresistance element according to claim 1, wherein the nonmagnetic layer comprises a nonmagnetic insulation layer.

4. The magnetoresistance element according to claim 1, wherein the antiferromagnetic layer comprises an insulating material.

5. The magnetoresistance element according to claim 1, wherein the magnetoresistance element comprises further an antiferromagnetic layer exchange-coupled to the second ferromagnetic layer.

6. A magnetic memory device employing the magnetoresistance element set forth in any of claims 1 to 5, memorizing information by change of a magnetization direction of the first ferromagnetic layer in accordance with the information.

7. A magnetoresistance element comprising a substrate,
   a first ferromagnetic layer formed on the substrate,
   a second ferromagnetic layer formed in lamination on the first ferromagnetic layer and having lower coercivity than the first ferromagnetic layer,
   a nonmagnetic layer formed between the first and second ferromagnetic layers,
   a first antiferromagnetic layer exchange-coupled to the first ferromagnetic layer, and
   a second antiferromagnetic layer exchange-coupled to the second ferromagnetic layer,
   wherein the direction of unidirectional anisotropy of the first antiferromagnetic layer is parallel to the magnetization direction of the first ferromagnetic layer, and the direction of unidirectional anisotropy of the second antiferromagnetic layer is parallel to the magnetization direction of the second ferromagnetic layer, and
   wherein the unidirectional anisotropy of the first antiferromagnetic layer may reverse with a reverse of magnetization of the first ferromagnetic layer, and the unidirectional anisotropy of the second antiferromagnetic layer may reverse with a reverse of magnetization of the second ferromagnetic layer.

8. A magnetic memory device employing the magnetic resistance element set forth in claim 7, memorizing information by change of the magnetizing direction of the first ferromagnetic layer in accordance with the information, and employing the second ferromagnetic layer as a detection layer for detecting the memorized information.

* * * * *